United States Patent
Cassidy et al.

(10) Patent No.: US 10,818,310 B2
(45) Date of Patent: Oct. 27, 2020

(54) DISTORTION SENSING, PREVENTION, AND DISTORTION-AWARE BASS ENHANCEMENT

(71) Applicant: DTS, inc., Calabasas, CA (US)

(72) Inventors: Ryan James Cassidy, San Diego, CA (US); Aaron Kube Warner, Seattle, WA (US); Themis George Katsianos, Highland, CA (US)

(73) Assignee: DTS, Inc., Calabasas, CA (US)

( * ) Notice: Subject to any disclaimer, the term of this patent is extended or adjusted under 35 U.S.C. 154(b) by 0 days.

(21) Appl. No.: 16/782,574

(22) Filed: Feb. 5, 2020

(65) Prior Publication Data

US 2020/0176011 A1 Jun. 4, 2020

Related U.S. Application Data

(62) Division of application No. 15/789,902, filed on Oct. 20, 2017, now Pat. No. 10,600,431.

(Continued)

(51) Int. Cl.
*G10L 21/0232* (2013.01)
*G06N 20/00* (2019.01)
(Continued)

(52) U.S. Cl.
CPC .......... *G10L 21/0232* (2013.01); *G06N 20/00* (2019.01); *H03G 3/3005* (2013.01);
(Continued)

(58) Field of Classification Search
USPC .......... 381/58, 59, 71.1, 94.2, 102, 103, 119
See application file for complete search history.

(56) References Cited

U.S. PATENT DOCUMENTS

| 6,134,330 A | 10/2000 | De Poortere et al. |
| 6,154,550 A | 11/2000 | Beyer |

(Continued)

FOREIGN PATENT DOCUMENTS

WO WO-2018075967 A1 4/2018

OTHER PUBLICATIONS

"U.S. Appl. No. 15/789,902, Final Office Action dated Sep. 12, 2019", 12 pgs.

(Continued)

*Primary Examiner* — Yosef K Laekemariam
(74) *Attorney, Agent, or Firm* — Schwegman Lundberg & Woessner, P.A.

(57) ABSTRACT

Systems and methods to provide distortion sensing, prevention, and/or distortion-aware bass enhancement in audio systems can be implemented in a variety of applications. Sensing circuitry can generate statistics based on an input signal received for which an acoustic output is generated. In various embodiments, the statistics can be used such that a multi-notch filter can be used to provide input to a speaker to generate the acoustic output. In various embodiments, the statistics from the sensing circuitry can be provided to a bass parameter controller coupled to bass enhancement circuitry to operatively provide parameters to the bass enhancement circuitry. The bass enhancement circuitry can provide a bass enhanced signal for generation of the acoustic output, based on the parameters. Various combinations of a multi-notch filter and bass enhancement circuitry using statistics from sensing circuitry can be implemented to provide an enhanced acoustic output. Additional apparatus, systems, and methods are disclosed.

14 Claims, 19 Drawing Sheets

Related U.S. Application Data

(60) Provisional application No. 62/411,415, filed on Oct. 21, 2016.

(51) Int. Cl.

| | | |
|---|---|---|
| *H03G 9/02* | (2006.01) | |
| *H03G 3/30* | (2006.01) | |
| *H04R 1/22* | (2006.01) | |
| *H04R 3/00* | (2006.01) | |
| *H03G 5/16* | (2006.01) | |
| *H04R 3/04* | (2006.01) | |

(52) U.S. Cl.
CPC ............. *H03G 9/025* (2013.01); *H04R 1/22* (2013.01); *H04R 3/007* (2013.01); *H03G 5/165* (2013.01); *H04R 3/04* (2013.01); *H04R 2499/11* (2013.01)

(56) References Cited

U.S. PATENT DOCUMENTS

| | | | |
|---|---|---|---|
| 7,171,010 B2 | 1/2007 | Martin et al. | |
| 8,625,813 B2 | 1/2014 | Vickers | |
| 10,559,316 B2 | 2/2020 | Cassidy et al. | |
| 10,600,431 B2 | 3/2020 | Cassidy et al. | |
| 2004/0179387 A1* | 9/2004 | Abraham | H03H 21/0021 365/145 |
| 2005/0226356 A1* | 10/2005 | Pirzada | G06F 11/00 375/350 |
| 2006/0126851 A1 | 6/2006 | Yuen et al. | |
| 2007/0253576 A1 | 11/2007 | Bai et al. | |
| 2008/0091416 A1 | 4/2008 | Kim et al. | |
| 2008/0175409 A1 | 7/2008 | Lee et al. | |
| 2011/0091048 A1 | 4/2011 | Bai et al. | |
| 2012/0259626 A1 | 10/2012 | Li et al. | |
| 2013/0163784 A1 | 6/2013 | Tracey et al. | |
| 2014/0140522 A1 | 5/2014 | Deng | |
| 2014/0341394 A1 | 11/2014 | Croft, III | |
| 2014/0348358 A1 | 11/2014 | Kraemer | |
| 2015/0030165 A1 | 1/2015 | Risberg et al. | |
| 2015/0146890 A1 | 5/2015 | Yang et al. | |
| 2016/0275045 A1* | 9/2016 | Boutaud | G05B 23/024 |
| 2018/0114536 A1 | 4/2018 | Cassidy et al. | |
| 2018/0115824 A1 | 4/2018 | Cassidy et al. | |
| 2020/0118581 A1 | 4/2020 | Cassidy et al. | |

OTHER PUBLICATIONS

"U.S. Appl. No. 15/789,902, Non Final Office Action dated Mar. 26, 2019", 8 pgs.

"U.S. Appl. No. 15/789,902, Notice of Allowance dated Nov. 20, 2019", 6 pgs.

"U.S. Appl. No. 15/789,902, Response filed Oct. 30, 2019 to Final Office Action dated Sep. 12, 2019", 11 pgs.

"U.S. Appl. No. 15/789,902, Response filed Dec. 3, 2018 to Restriction Requirement dated Oct. 3, 2018", 9 pgs.

"U.S. Appl. No. 15/789,902, Response filed Jun. 25, 2019 to Non-Final Office Action dated Mar. 26, 2019", 10 pgs.

"U.S. Appl. No. 15/789,902, Restriction Requirement dated Oct. 3, 2018", 6 pgs.

"U.S. Appl. No. 15/789,906, 312 Amendment filed Dec. 4, 2019", 9 pgs.

"U.S. Appl. No. 15/789,906, Corrected Notice of Allowability dated Nov. 15, 2019", 2 pgs.

"U.S. Appl. No. 15/789,906, Non Final Office Action dated Mar. 27, 2019", 11 pgs.

"U.S. Appl. No. 15/789,906, Non Final Office Action dated Oct. 5, 2018", 7 pgs.

"U.S. Appl. No. 15/789,906, Notice of Allowance dated Sep. 17, 2019", 9 pgs.

"U.S. Appl. No. 15/789,906, PTO Response to Rule 312 Communication dated Dec. 20, 2019", 2 pgs.

"U.S. Appl. No. 15/789,906, Response filed Dec. 4, 2018 to Restriction Requirement dated Oct. 5, 2018", 11 pgs.

"U.S. Appl. No. 15/789,906, Response filed Jun. 25, 2019 to Non-Final Office Action dated Mar. 27, 2019", 13 pgs.

"U.S. Appl. No. 16/710,435, Notice of Allowance dated Jan. 17, 2020", 8 pgs.

"International Application Serial No. PCT/US2017/057729, International Preliminary Report on Patentability dated May 2, 2019", 24 pgs.

"International Application Serial No. PCT/US2017/057729, International Search Report dated Dec. 28, 2017", 2 pgs.

"International Application Serial No. PCT/US2017/057729, Written Opinion dated Dec. 28, 2017", 22 pgs.

"U.S. Appl. No. 16/710,435, Notice of Allowance dated Apr. 15, 2020", 8 pgs.

\* cited by examiner

DISTORTION SENSING, PREVENTION, AND DISTORTION-AWARE BASS ENHANCEMENT

RELATED APPLICATIONS

This application is a Divisional of U.S. patent application Ser. No. 15/789,902, filed on Oct. 20, 2017, which claims priority under 35 U.S.C. 119(e) from U.S. Provisional Application Ser. No. 62/411,415, filed 21 Oct. 2016, the contents of which are incorporated herein by reference in their entireties.

HELD OF THE INVENTION

The present invention relates generally to apparatus and methods of processing of audio signals.

BACKGROUND

The physical size of consumer devices has decreased significantly over the years and this trend is at odds with an ideal acoustic environment. This reduction in device size has necessitated the use of micro-loudspeakers, which are designed differently than their typical loudspeaker counterparts. One salient drawback of a micro-loudspeakers, as can be seen in FIG. 1, is their reduced low frequency response, which for more acceptable audio quality, requires a significant amount of flattening equalization (EQ). FIG. 1 is an example of a micro-loudspeaker frequency response, where speaker resonance ($f_o$) is 845 Hz and the quality factor of the resonance in a closed box (Qtc) is 3.0.

The shape of such an equalization curve below 2 kHz typically contains at least three components: highpass, low-frequency boost, and peak resonance attenuation, as depicted in FIG. 2. FIG. 2 is an example of a resulting micro-loudspeaker frequency response, curve 139, with the flattening EQ, curve 137, comprised of highpass, low shelf, and peak filters applied. Although a static compensating equalization can dramatically improve the subjective and objective performance, at low or even moderate sound pressure level (SPL), the flattening equalization can cause distortions from loudspeaker over excursion at higher listening levels. For this reason there are several solutions in the market that provide a dynamic flattening equalization algorithm guided by a loudspeaker excursion model. These solutions essentially, attempt to apply as much flattening equalization as possible without causing over excursion of the membrane or diaphragm within the loudspeaker. When measuring these solutions using common synthetic log swept sinusoidal (LSS) signals, stationary tones or even noise, these systems seem to work fairly well despite having high levels of measured total harmonic distortion (THD).

Alternatively, it has been observed on several portable devices using micro-loudspeakers, that multi-tonal signals having only moderate amounts of energy below the speaker resonance can exhibit significant amounts of what is commonly referred to as "rub and buzz" distortion. It is, however, unclear if the cause of the distortion is from over-excursion or other acoustic/mechanical issue within the speaker and enclosure. Determining this would require measurements of the excursion using a speaker enclosure modified with a clear panel exposing the internal loudspeaker and a laser vibrometer to observe the loudspeaker excursion during the distortion events. Also, the low frequency boost within typical loudspeaker flattening solutions exacerbates the issue because the excursion models guiding the time varying equalization may be blind to the circumstances causing the distortion, leaving the equalization curve over engaged.

BRIEF DESCRIPTION OF THE DRAWINGS

FIG. 2.1 is a flow diagram of features of an example method of sensing distortion and reducing the distortion for acoustic output generated from a speaker, in accordance with various embodiments.

DETAILED DESCRIPTION

Figure 1:
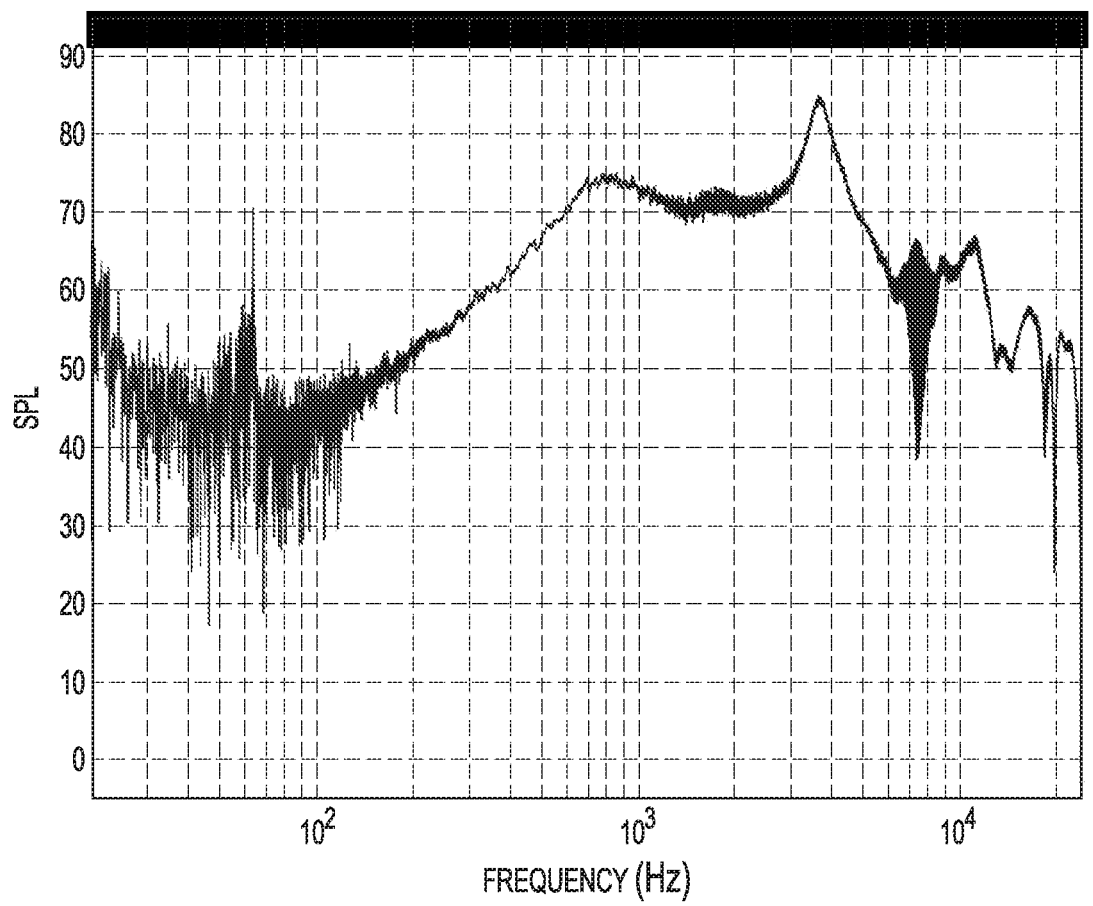
FIG. 1 is an example of a micro-loudspeaker frequency response.
Figure 2:
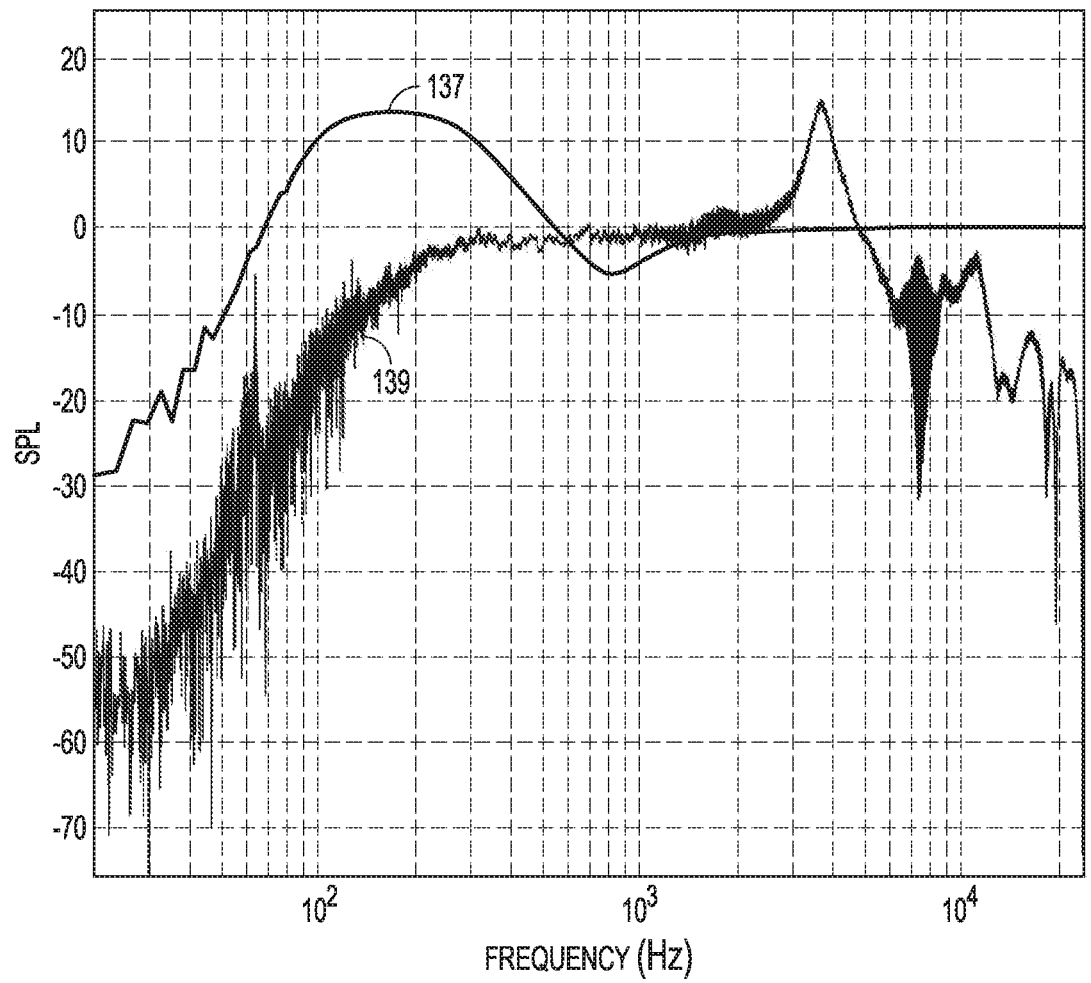
FIG. 2 is an example of a micro-loudspeaker frequency response with flattening equalization comprised of highpass, low shelf, and peak filters applied.

In the following description of embodiments of an audio system and method, reference is made to the accompanying drawings. These drawings show, by way of illustration and not limitation, specific examples of how various embodiments may be practiced. These embodiments are described in sufficient detail to enable those skilled in the art to practice these and other embodiments. Other embodiments may be utilized, and structural, logical, electrical, and mechanical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, dynamic multi-feature distortion sensing and adaptive, multi-band distortion reduction can be implemented for audio signals. An apparatus can be structured to sense quantitative degree of empirical nonlinear distortion produced by a speaker for a given sound input, and to reduce the distortion by a bank of notch or band-reject filters. Here a speaker is any electroacoustic output transducer intended for audio listening. This includes, but is not limited to, one of: a loudspeaker, a micro-speaker, an earphone, a headset driver, a headphone driver, or an earpiece. Such an apparatus can use multiple features obtained from the audio or a range of other possible audio features. Statistics can be computed based on energies from bandpass filters at discrete frequencies or frequency bands. The bank of notch or band-reject filters can be arranged in cascade or in parallel.

Dynamic multi-feature distortion sensing and adaptive, multi-band distortion reduction can have application in the improvement of sound quality produced by a loudspeaker. Distortion-triggering spectral components of the signal for the audio output can be reduced or removed such that the number of components removed can be kept to a minimum. At the same time, a different set of features or spectral components may be used to sense the distortion; the analysis components or features need not correspond directly to the reduced/removed components.

In various embodiments, a system and a method using the system can include receiving a signal for an acoustic output, processing the received signal using a processing module that includes at least one notch filter. A module is a set of one or more instrumentalities to execute a specific function, where the instrumentalities can include hardware, processors to execute instructions stored in a memory device, firmware, logic circuitry, or combinations thereof. The parameters of the notch filter(s) can be determined based on sensing to detect a likelihood of distortion of the acoustic output. The output of the notch filter can be fed to a device, a process, or an apparatus that contains observable audio distortion. The device, process, or apparatus can be acoustic or digital or any device capable of outputting audio. Moreover, at least one parameter of the at least one notch filter can be determined by a sensor, a measure, a statistic, or combinations thereof that measure the likelihood of distortion at the output or the degree of perceptible, objectionable, or measurable distortion at the output.

In various embodiments, distortion-aware harmonic bass enhancement can be implemented for audio signals. Sensing a quantitative degree of empirical nonlinear distortion can be used in conjunction with a flexible harmonic bass enhancement algorithm. An adaptive harmonic bass enhancement module can be used in various applications. Enhancement may be avoided when harmonics from the enhancement would trigger objectionable distortion. The module can employ a tunable asymmetric nonlinearity along with pre-cutoff filtering and post-cutoff filtering to vary an amount of harmonic energy added to the signal.

In various embodiments, a system and a method using the system can include receiving a signal for an acoustic output and processing the received signal using a processing module that performs bass enhancement. Performance of bass enhancement can include, but is not limited to, bass enhancement based on linear filtering, bass enhancement based on insertion and/or generation of additional harmonics of a signal bearing audio content (a.k.a. psychoacoustic bass enhancement), or combinations thereof. Parameters of the bass enhancement can be determined based on sensing to detect the likelihood of distortion. The output of the bass enhancement module can be fed to a device, a process, or an apparatus that contains observable audio distortion. The device, process, or apparatus can be acoustic or digital or any device capable of outputting audio. Further, at least one parameter of the bass enhancement module can be determined by a sensor, a measure, a statistic, or combinations thereof that measure the likelihood of distortion at the output. Bass enhancement may provide for maintaining bass and percussive strength in output audio in the presence of distortion.

Embodiments of dynamic multi-feature distortion sensing and adaptive, multi-band distortion reduction can function independently from embodiments of distortion-aware harmonic bass enhancement. Embodiments of distortion-aware harmonic bass enhancement can function independently from embodiments of dynamic multi-feature distortion sensing and adaptive, multi-band distortion reduction. In various embodiments, dynamic multi-feature distortion sensing and adaptive, multi-band distortion reduction and distortion-aware harmonic bass enhancement can be combined to best avoid distortion from bass enhancement.

A processing algorithm is described herein for reducing the above described distortion, which may include rub and buzz distortion, by reducing the energy at critical harmonic intervals below and relating to the micro-loudspeakers resonance frequency. The algorithm can include a multi-notch filter applied to the loudspeakers input signal, multi-tone signal analysis to measure the amount of energy contributing to distortion, and a dynamic gain cell controlling the time varying depth of the notch filters. Parameters of the notch filters such as notch frequencies can be configured offline with the dynamic control of the depths of the notches performed in real time. With respect to signal processing, by real time is meant completing some signal/data processing within a time that is sufficient to keep up with an external process, such as generating an acoustic output from serial processing of an input audio signal.

Figure 3:
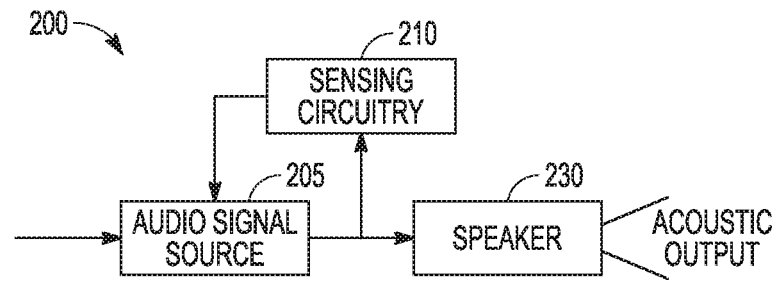
FIG. 3 is a block diagram of features of an example architecture to provide dynamic distortion sensing and adaptive distortion reduction, in accordance with various embodiments.

FIG. 3 is a block diagram of an embodiment of an example system 200 having a speaker 230 to generate an acoustic output in response to a signal from an audio signal source 205. An audio signal source can include not only audio from direct playback of a recorded or engineered soundtrack or sound stream, but also the audio signal emerging from other processing (e.g., spatial processing) of that soundtrack or sound stream, or other sources for generation of an acoustic output from a speaker. System 200 can include sensing circuitry 210 that can be coupled to receive the signal received by speaker 230. Sensing circuitry 210 generate statistics on the signal to modify the signal received by speaker 230. Speaker 230 can generate the acoustic output based on the received signal modified in response to the generation of the statistics by sensing circuitry 210. Sensing circuitry 210 can be implemented with circuitry that includes a processing device and stored instructions to process signals provided to sensing circuitry 310. Sensing circuitry 210 can be implemented in a digital signal processor.

Variations of system 200 or systems similar to system 300 can include a number of different embodiments that may be combined depending on the application of such systems and/or the architecture of the systems in which a number of methods can be implemented. Such systems can include the sensing circuitry being operable to generate statistics that measure a likelihood of distortion at an output of the speaker or measure a degree of objectionable, perceptible, or measurable distortion at an output of the speaker. The sensing circuitry can be operable to compute a binary indicator of the distortion at an output of the speaker using a technique selected from a group including machine learning, statistical learning, predictive learning, or artificial intelligence. Technique can use one or more procedures selected from a group including classification and regression trees, support vector machines, artificial neural networks, logistic regression, naïve Bayes classification, linear discriminant analysis, and random forests. The sensing circuitry can be operable to compute a soft indicator corresponding to a likelihood of distortion or a degree of objectionable, perceptible, or measurable distortion at an output of the speaker using a technique selected from a group including machine learning, statistical learning, predictive learning, and artificial intelligence. A soft indicator may also be referred to as a fuzzy indicator. A soft indicator is a numeric value selected from one or more ranges of numeric values. A hard indicator can be defined as a numeric value selected from a set of discrete numerical values.

Variations of system 200 or systems similar to system 200 can include sensing circuitry 210 to include multiple infinite impulse response (IIR) or finite impulse response (FIR) band-pass filters, and/or dynamic spectrum analysis filters, tuned to frequencies determined to contribute to distortion for the speaker. Sensing circuitry 210 can include circuitry to estimate amount of distortion activating energy in a filtered signal from the multiple IIR or FIR band-pass filters and/or dynamic spectrum analysis filters as one or more statistics computed from energy across all bands of the multiple band-pass and/or dynamic spectrum analysis filters, and includes circuitry to measure total energy of the filtered signal. The one or more statistics can include one or more statistics from a group of statistics including a median, a mean, an arithmetic mean, a geometric mean, a maximum of the energy, a minimum of the energy, and energy of a nth largest energy among all band-pass energies computed with n being a selected positive integer. Sensing circuitry 210 can be arranged to compute energy as time-varying energy or compute an envelope of a full-band audio signal.

Figure 4:
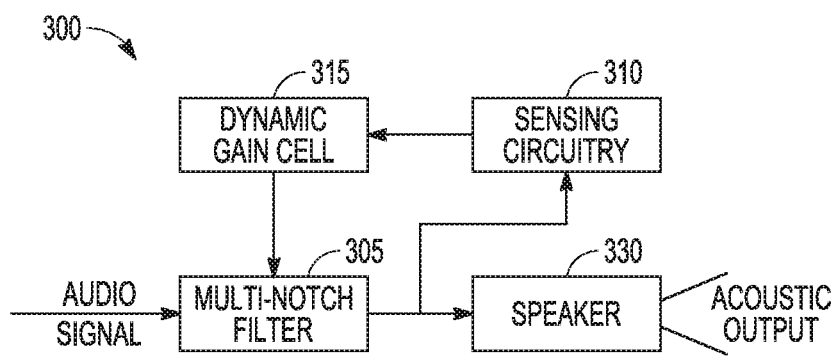
FIG. 4 is a block diagram of features of an example architecture to provide dynamic distortion sensing and adaptive, multi-band distortion reduction, in accordance with various embodiments.

FIG. 4 is a block diagram of an embodiment of an example architecture 300 to provide dynamic multi-feature distortion sensing and adaptive, multi-band distortion reduction. Architecture 300 can be incorporated into a number of different systems that provide an acoustic output. Architecture 300 can include a multi-notch filter 305, sensing circuitry 310, and a dynamic gain cell 315 operable with a speaker 330 that provides acoustic output. Speaker 330 can be realized as a micro-loudspeaker, but may alternatively be realized as any electroacoustic output transducer intended for audio listening. This includes, but is not limited to, one of: a loudspeaker, a micro-speaker, an earphone, a headset driver, a headphone driver, or an earpiece. Multi-notch filter 305 can be arranged to receive a signal for generating an acoustic output. A signal for generating an acoustic output, herein, is a signal that is representative of a physical sound and can be referred to as an "audio signal." Sensing circuitry 310 can be coupled to receive a filtered signal corresponding to the signal received and processed by multi-notch filter 305 and to generate statistics on the filtered signal.

Sensing circuitry 310 can be arranged in a number of ways. Sensing circuitry 310 can include multiple infinite impulse response (IIR) or finite-impulse response (FIR) bandpass filters, and/or dynamic spectrum analysis filters, tuned to frequencies determined to contribute to distortion for the speaker 330. Sensing circuitry 310 can include circuitry to estimate amount of distortion activating energy in the filtered signal using one or more of a variety of statistics computed from the energy across all bands of the multiple IIR or FIR bandpass filters, and/or dynamic spectrum analysis filters, and can include circuitry to measure total energy of the filtered signal. Sensing circuitry 310 can be operable to generate statistics that measure a likelihood of distortion, or the degree of perceptible, objectionable, or measurable distortion, at an output of speaker 330. Sensing circuitry 310 can be implemented with circuitry that includes a processing device and stored instructions to process signals provided to sensing circuitry 310.

Sensing circuitry 310 can be structured as operable to compute a measure of a likelihood of distortion, or the degree of perceptible, objectionable, or measurable distortion, at an output of the speaker using a technique selected from a group including machine learning, statistical learning, predictive learning, and artificial intelligence (AI). The technique can use one or more procedures selected from a group including classification and regression trees a.k.a decision trees), ordinary least squares regression, weighted least squares regression, support vector regression, an artificial neural network, piecewise-linear regression, ridge regression, lasso regression, elastic-net regression, and non-linear regression. The artificial neural network can include, but is not limited to, perceptron, multilayer perceptron, deep belief networks, and deep neural networks. Nonlinear regression can include, but is not limited to, polynomial regression.

Sensing circuitry 310 can be structured to be operable to compute a binary indicator of the distortion at an output of the speaker using a technique selected from a group including machine learning, statistical learning, predictive learning, or artificial intelligence. The binary indicator can provide a yes/no indication of distortion. The technique can use one or more procedures selected from a group including classification and regression trees, support vector machines, artificial neural networks, logistic regression, naïve Bayes classification, linear discriminant analysis, and random forests. Support vector machines can include support vector classification. The artificial neural network can include, but is not limited to, perceptron, multilayer perceptron, deep belief networks, and deep neural networks.

Sensing circuitry 310 can be structured to be operable to compute a binary indicator via derivation from a soft indicator by use of a threshold or comparator device. Alternatively, a semi-binary or semi-hard indicator may be derived from a soft indicator by use of a threshold, thereby yielding a discrete indication for input values above/below a certain threshold, and a variable indication for input values below/above a certain threshold. A semi-hard indicator can be defined as a value selected from a combination of discrete values and one or more ranges of values. For example, a semi-hard indicator can be a value selected from a combination of values consisting of a discrete value of 0.0 and values in the range of (0.5, 1.0), for a particular task. The combination of one or more discrete values and one or more ranges of values depends on the application for which a semi-hard value is generated. A semi-binary indicator is a semi-hard indicator having a value selected from a combination of discrete values of zero and one and one or more ranges of values between zero and one. In the case of a binary or semi-binary indicator derived in this manner, hysteresis may be employed to avoid issuing a discrete indication for only brief excursions of the soft indicator past the threshold values).

The techniques selected from machine learning, statistical learning, predictive learning, and artificial intelligence (AI) may be trained using the supervised learning paradigm familiar in the art, described in a number of features as follows. First, a set of representative audio recordings, including content from music, film, and speech (among other types may be collected and assembled. Second, these recordings may be played back through the audio signal processing cascade detailed in the foregoing description, but with the multi-notch filter bypassed. They may be played back at various volume or gain levels typical of actual playback scenarios, with particular focus on maximum volume playback. The acoustic output from the speaker (including a micro-speaker) during playback may be recorded using a calibrated measurement microphone at a fixed distance from the speaker in a quiet or anechoic environment.

Third, each measurement recording may be analyzed with reference to the original content recording to determine and label portions of the measurement recording with the presence, absence, or degree of perceptible, objectionable, or measurable distortion present. In order to characterize portions of perceptible or objectionable distortion, a listening test may be performed with human subjects, or a computational psychoacoustic model of distortion, chosen among several of such models familiar in the art, may be employed, wherein both the measurement recording and the original content recording are compared, either subjectively or numerically. In order to characterize portions of measurable distortion, a level-matching gain may be applied to the original content recording, so that its low-level portions (chosen as sufficiently low in level to be assumed undistorted) match the levels of the corresponding measurement recording. In addition, the level-matched original content recording may be time-aligned to the corresponding measurement recording. The time-varying magnitude of measurable distortion may be computed as the envelope or time-varying RMS energy of the difference between the aligned original content recording and the corresponding measurement recording.

Fourth, portions of labeled measurement audio recordings may be sub-divided into training and test sets, where the balance between undistorted and distortion portions is approximately equal in both sets. Fifth, sets of audio features computed from successive frames or blocks of distorted and undistorted portions may be computed. Sixth, a classification or regression technique selected from machine learning, statistical learning, predictive learning, and artificial intelligence (AI) techniques familiar in the art, may be trained on the training set, with a measure of regression or classification performance on the training set monitored as training progresses. Seventh, a measure of regression of classification performance may be computed from the predictions of the trained model computed on audio features from the test set. Steps 4 through 7 are known as cross-validation, an established paradigm in the art of machine learning, statistical learning, predictive learning, and artificial intelligence (AI). These steps may be iterated to improve classification or regression performance.

Dynamic gain cell 315 can be coupled to receive the statistics from sensing circuitry 310 and coupled to multi-notch filter 305 to operatively modify depth of multi-notch filter 305. Speaker 330 can be arranged to receive the filtered signal to generate the acoustic output. Dynamic gain cell 315 can be arranged to provide a gain to adjust the depth of the multi-notch filter based on a subsequent statistic based on the bandpass-energy-based statistic above and the total energy, where the bandpass-energy-based statistic and measured total energy are provided by sensing circuitry 310.

Figure 5:
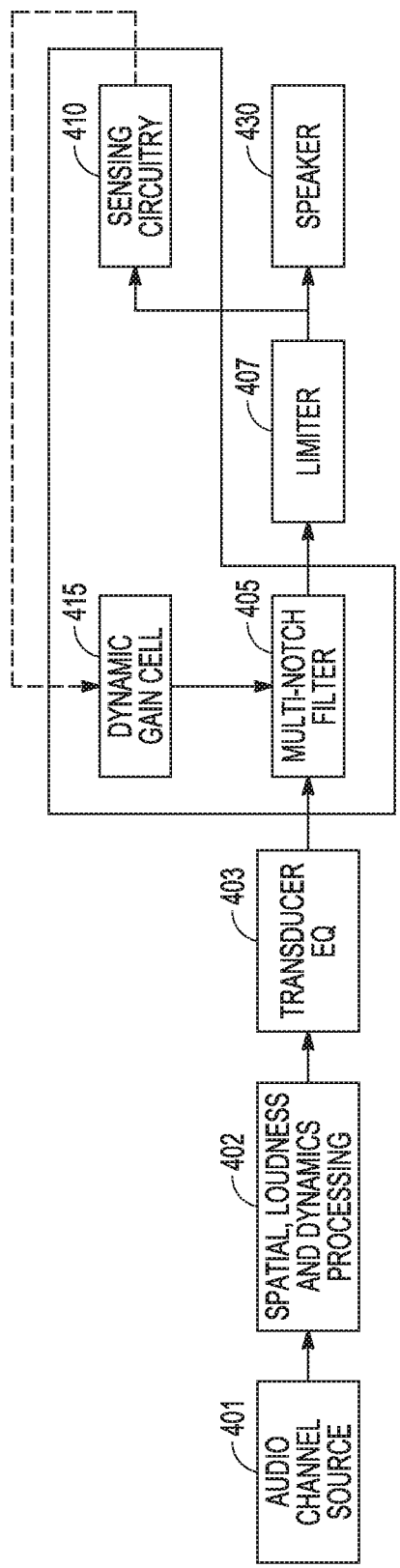
FIG. 5 is a block diagram of example architecture depicting the integration of a multi-notch filter with external audio hardware and signal processing components, in accordance with various embodiments.

FIG. 5 is a block diagram of an embodiment of an example architecture 400 depicting the integration of a multi-notch filter 405 with external audio hardware and signal processing components. Architecture 400 includes an audio channel source 401 that feeds processing 402 in spatial, loudness, and dynamics, whose output is input to a transducer equalization 403. The output of transducer equalization 403 is input to multi-notch filter 405, whose output is directed to speaker 430 through a limiter 407. Speaker 430 can be realized as a micro-loudspeaker. Limiter 407 permits signals below a specified input threshold level to pass unaffected while attenuating the peaks of stronger signals that exceed this threshold. In addition to the output of limiter 407 being coupled to speaker 430, the output of limiter 407 can be coupled to sensing circuitry 410. Sensing circuitry 410 can use multiple features obtained from the audio signal or a range of other possible audio signal features to provide statistics to dynamic gain cell 415. Based on the statistics or other information regarding an audio signal that leads to an acoustic output, dynamic gain cell 415 can provide input to multi-notch filter 405 to operatively modify depth of multi-notch filter 405. Multi-notch filter 405, sensing circuitry 410, and dynamic gain cell 415 can be realized in a manner similar to or identical to multi-notch filter 305, sense circuitry 310, and dynamic gain cell 315 of FIG. 4.

Figure 6:
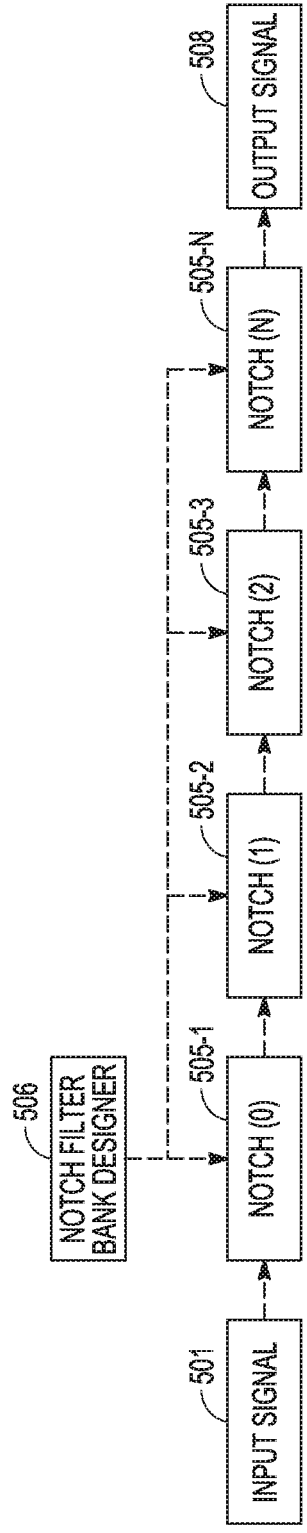
FIG. 6 is a block diagram of an example illustrating a notch filter bank designer configuring coefficients for each notch band filter in a series of multiple notch band filters between an input signal and an output signal, in accordance with various embodiments.

When a micro-loudspeaker is driven using certain multi-tone signals, the rub and buzz distortion can be activated. Using a tuned static multi-notch filter, as shown in FIG. 6, the energy activating the distortion can be reduced to a level below the loudspeakers distortion activation threshold. FIG. 6 is a block diagram of an example embodiment illustrating a notch filter bank designer 506 configuring coefficients for each notch band filter, 505-1, 505-2 . . . 505-N in a series of N notch band filters between input signal 501 and output signal 508. The number of notches employed and the configuration of each notch can be determined from a set of design controls.

There are essentially two goals when designing a multi-notch filter: removing distortion and minimally affecting the perceived timbre of the sound. Timbre is a characteristic quality of a sound, independent of pitch and loudness, from which its source or manner of production can be inferred. Generally, it is a best practice to begin a tuning with the goal of removing distortion using test content that is known to activate the distortion of interest using a static multi-notch filter.

A number of parameters can be used in the tuning, with each loudspeaker channel having its own set of parameters. Such parameters can include the number of notch bands, basis frequency, basis Q, basis notch depth, basis slope, bandwidth scale, and frequency scale. The number of notch bands is the total number of notch frequency bands. Basis frequency is the cutoff frequency of the lowest frequency. Basis Q is the bandwidth of the lowest frequency notch. Basis notch depth (dB) is the attenuation applied to the lowest frequency notch band when fully engaged. Basis slope (dB/band) is an amount progressively added to each additional bands notch depth. With respect to bandwidth scale, starting from the first low frequency band, additional bands can maintain a constant Q factor or constant bandwidth. With respect to frequency scale, notch frequencies can maintain a linear scaling from the basis frequency (e.g. [100, 200, 300] Hz), or an octave scaling (e.g. [100, 200, 400] Hz).

Figure 7:
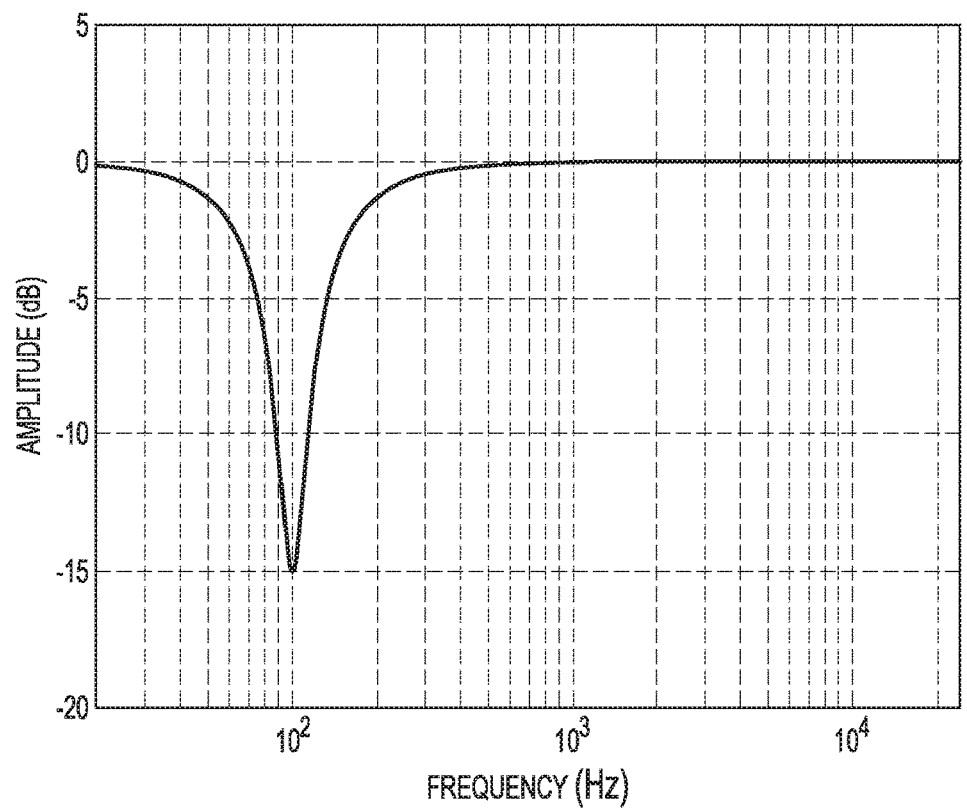
FIG. 7 illustrates a signal notch band adjusted to determine lowest frequency useful for reducing the distortion, in accordance with various embodiments.

A first step in tuning may include a determination of the basis frequency by adjusting a single notch band, for example, having a relatively low basis Q of approximately 4, a depth of approximately −15 dB, and sweeping the cutoff frequency starting from approximately 100 Hertz up in frequency until a noticeable amount of distortion is removed. Although the parameters of the multi-notch filter are determined using a heuristic methodology, the most optimal cutoff frequencies tend to have a harmonic relationship near or at the loudspeakers resonance frequency. Using FIG. 7 as an example, given a micro-loudspeaker resonance frequency of 800 Hz, a likely optimal basis frequency would be near 100 or 200 Hz, depending on the usable low frequency response of the loudspeaker. FIG. 7 illustrates a single notch band adjusted to determine lowest frequency useful for reducing the distortion. Modification of the basis Q parameter may assist in discovering the basis frequency.

Figure 8:
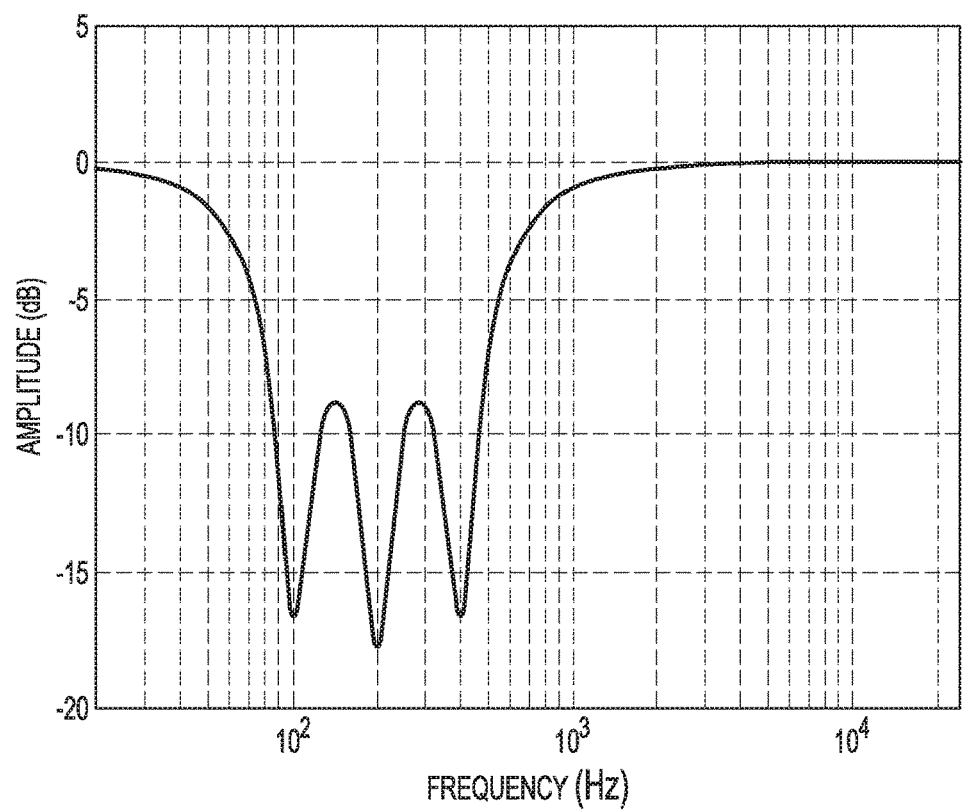
FIG. 8 illustrates that a number of notch bands used can be increased to further reduce distortion using a linear or octave frequency spacing, in accordance with various embodiments.
Figure 9:
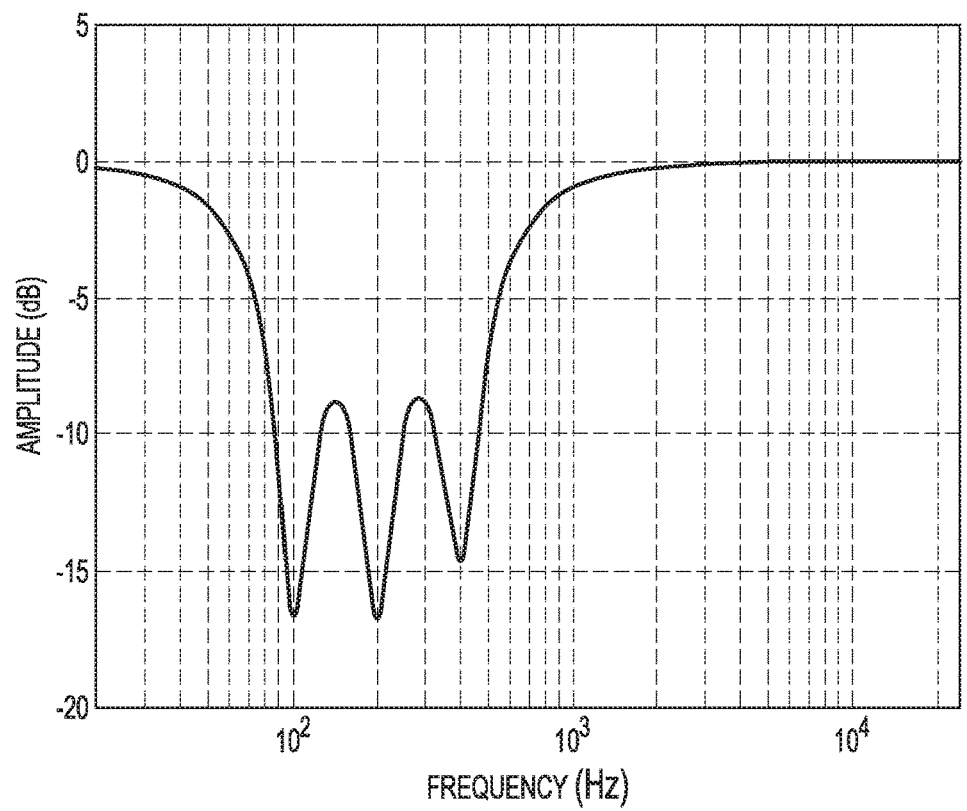
FIG. 9 illustrates that the effectiveness of each band is weighed using a slope parameter, in accordance with various embodiments.

An optimal frequency scale and number of notch bands can be determined. After establishing the basis frequency, additional frequencies above the basis frequency and below the loudspeakers resonance frequency that contribute to a reduction in distortion can be discovered. These frequencies should have a linear or octave scaling, relative to the basis frequency, as shown in FIG. 8. FIG. 8 illustrates that the number of notch bands can be increased to further reduce distortion using a linear or octave frequency spacing. The number of notches indicated in the plot, three (3), does not limit or restrict the number of notches to that particular value, which may be arbitrary (variable N as shown in FIG. 6). Having established a set of target multi-notch frequencies, one can adjust the design parameters of number of notch bands based on the total number of frequencies, basis frequency based on the lowest target frequency, and additional frequencies above the basis frequency. Basis notch depth, basis slope, and bandwidth scale can be adjusted. Within the established set of target frequencies, some notch bands will be more effective than others at removing the unwanted distortions. The notch depth and basis slope parameters can determine the amount of attenuation at each target frequency when the multi-notch filter is fully engaged. Typically, depth of the notch lessens as the notch frequency increases. The basis slope parameter will increase or decrease the depth of subsequent notches from the basis frequency. For example, in FIG. 9, with a basis notch depth of −15 dB and a basis slope of 3 dB, the specific depths of notches will be [−15, −12, −9, . . . ]. FIG. 9 illustrates that the effectiveness of each band is weighed using the slope parameter. Again, the number of notches is not limited or restricted to the number shown in the example of this figure. Positive notch depths can be prevented.

Figure 10:
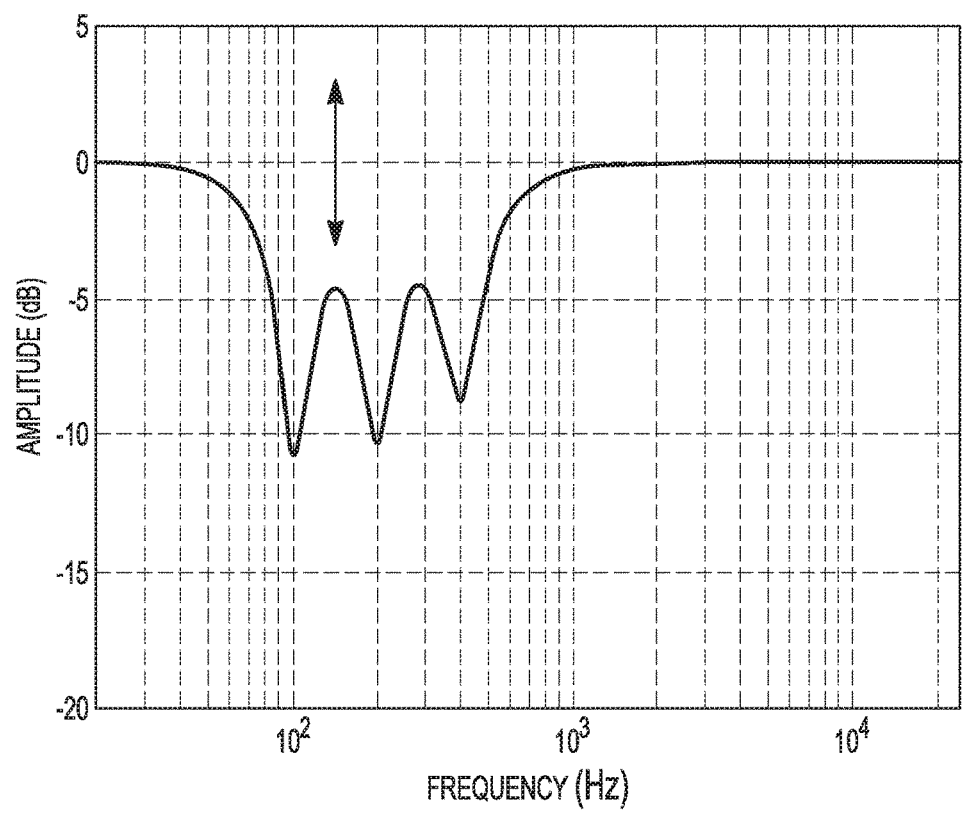
FIG. 10 illustrates a tradeoff between distortion and timbre as parameters of the multi-notch are re-adjusted for reduced attenuation, in accordance with various embodiments.

A tradeoff between distortion removal and the preservation of timbre can be made. This step can be based on the current parameter settings being reviewed for minimum impact on the subjective timbre. For example, the basis Q should be revised to be the highest setting (narrowest bandwidth) possible, while still preventing distortion. FIG. 10 illustrates a tradeoff between distortion and timbre as the parameters of the multi-notch are re-adjusted.

Multi-notch filters such as multi-notch filter 305 of FIG. 4 and multi-notch filter 405 of FIG. 4 can be implemented as a series of independent IIR notch filter bands. Each notch band can be implemented using a linear combination of the signal and an all-pass filter set to the cutoff frequency and Q of the band. Using this method, the filter coefficients can be determined statically at initialization using the cutoff frequency and bandwidth parameters, and the time-varying depth of the notch can be adjusted efficiently such that the notch depth may move up and down in real-time as shown by the bidirectional arrow in FIG. 10.

Figure 11:
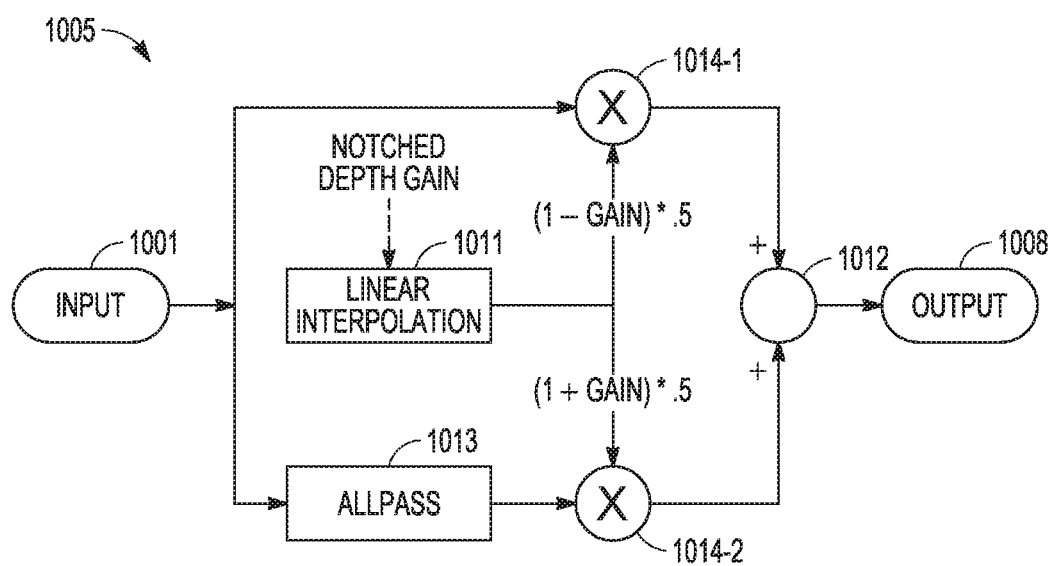
FIG. 11 is a schematic illustrating an example single notch band frequency filter implemented as a linear combination of an input signal and an all-pass response, in accordance with various embodiments.

FIG. 11 is a schematic illustrating an embodiment of an example single notch band frequency filter 1005 implemented as a linear combination of an input signal 1001 and an all-pass response 1013. Notched depth gain can be provided to a linear interpolation 1011 that provides a first factor, such as (1−gain)*0.5, to multiplier 1014-1 to multiply input signal 1001, and a second factor, such as (1+gain)*0.5, to multiplier 1014-2 to multiply all-pass response 1013. The results of multiplication are provided to summer 1012 for linear combination, providing an output signal 1008 from summer 1012.

A sense module, such as sensing circuitry 310 of FIG. 4 and sensing circuitry 410 of FIG. 5, to sense distortion can be structured to estimate the amount of distortion activating energy within the signal driving the loudspeaker. Therefore, there is ideally no further processing of the loudspeaker signal downstream of the sense module. The sense analysis can then be used in feedforward or feedback architectures to inform the dynamic gain cell to ultimately determine the independent depths within the multi-notch filter in architectures associated with FIG. 4 and FIG. 5. The sense analysis can be composed of multiple ER or FIR bandpass filters, and/or dynamic spectrum analysis filters, tuned to frequencies determined to contribute to rub and buzz or other objectionable distortion for a specific micro-loudspeaker. The bandwidth of each band is ideally very narrow and so two or more second-order IIR or FIR analysis filters, and/or dynamic spectrum analysis filters, in series per band can be used to achieve good signal energy measurements. Because energy within a single band does not activate the distortion, the estimated amount of distortion activating energy can be calculated as an aggregate statistic such as the arithmetic or geometric mean of the energy across all bands. This ensures that only multi-tonal band energy within a significant number of bands will result in a high estimate of distortion activating energy. Statistics other than an arithmetic or geometric mean may be used. The sense module also measures the total energy of the input signal.

Figure 12A:
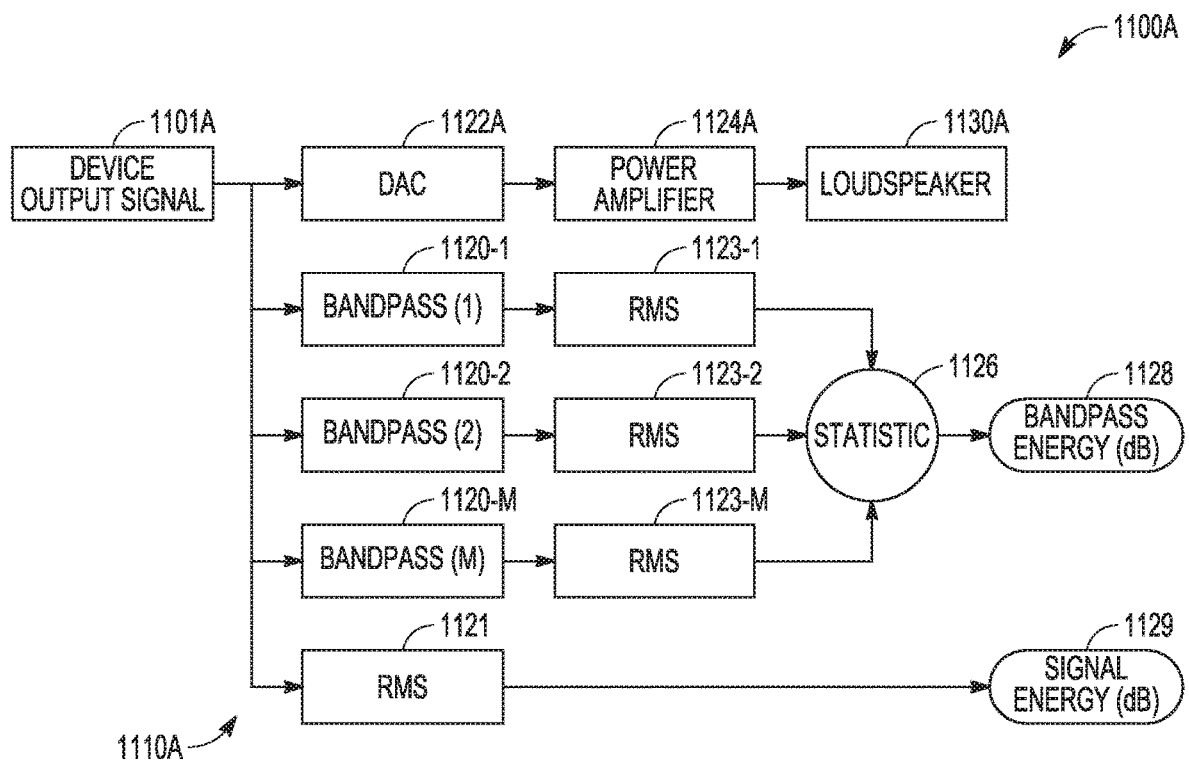
FIG. 12A is a block diagram of an example apparatus that provides an audio output to a loudspeaker in response to a device output signal and uses sensing circuitry to analyze device output signal, in accordance with various embodiments.

FIG. 12A is a block diagram of an embodiment of an example apparatus 1100A that provides an acoustic output from a loudspeaker 1130A in response to a device output signal 1101A and uses sensing circuitry 1110A to analyze device output signal 1101A. Device output signal 1101A can be directed to loudspeaker 11130A through a digital-to-analog converter (DAC) 1122A with amplification after the digital to analog conversion using a power amplifier 1124A.

Sensing circuitry 1110A can include bandpass filters 1120-1, 1120-2 . . . 1120-M coupled to a respective root mean square (RMS) circuits 1123-1, 1123-2 . . . 1123-M. The output of each RMS circuit 1123-1, 1123-2 . . . 1123-M can be coupled to a circuit to compute a statistic 1126. Statistic 1126 can be provided as bandpass energy (dB) for output from sensing circuitry 1110A. Statistic 1126 can include one or more statistics from a group of statistics including a median, a mean, an arithmetic mean, a geometric mean, a maximum of the energy, a minimum of the energy, and energy of a nth largest energy among all band-pass energies computed with n being a selected positive integer. Sensing circuitry 1110 can also include another RMS circuit 1121 to receive output signal 1101A and generate signal energy (dB) 1129, which can be output from sensing circuitry 1110A. These RMS circuits and the circuit to compute a statistic may include various types of memory devices and one or more processors, digital signal processors (DSPs), application specific integrated circuits (ASICs) and other computational devices. Bandpass energy (dB) 1128 and signal energy (dB) 1129, output from sensing circuitry 1110A, can be input to a dynamic gain cell.

Figure 12B:
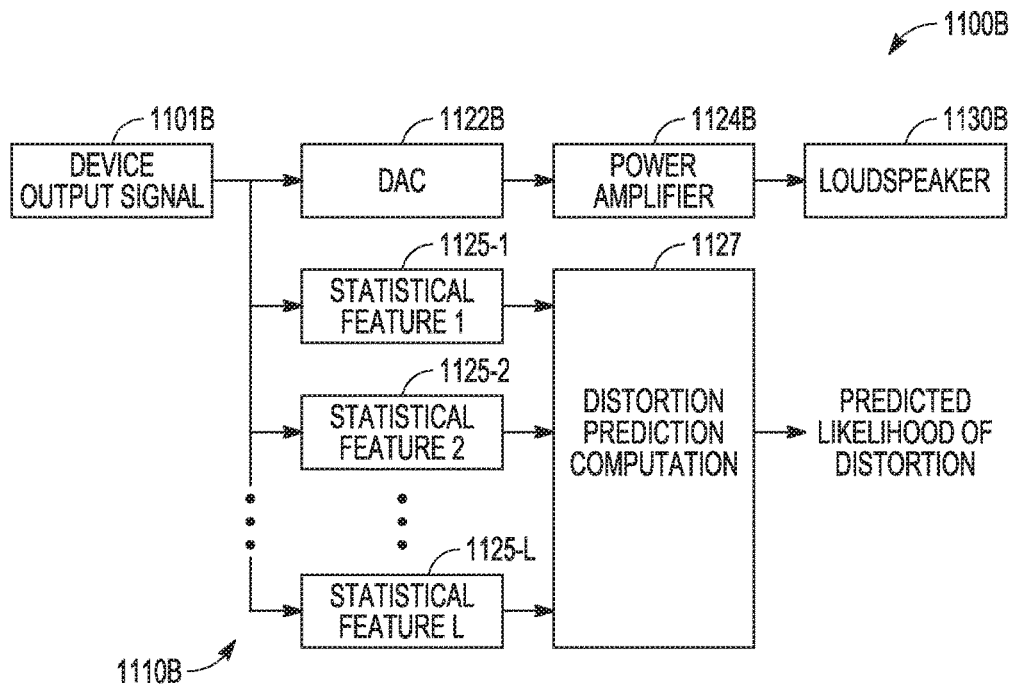
FIG. 12B is a block diagram of an example apparatus that provides an audio output to a loudspeaker in response to a device output signal and uses sensing circuitry to analyze device output signal, in accordance with various embodiments.

FIG. 12B is a block diagram of an embodiment of an example apparatus 1100B that provides an acoustic output from a loudspeaker 1130B in response to a device output signal 1101B and uses sensing circuitry 1110B to analyze device output signal 1101B. Device output signal 1101B can be directed to loudspeaker 1130B through a digital-to-analog converter (DAC) 1122B with amplification after the digital to analog conversion using a power amplifier 1124B.

Sensing circuitry 1110B can include a circuit to generate a statistical feature 1125-1, a circuit to generate statistical feature 1125-2 . . . a circuit to generate statistical feature 1125-L, where each is coupled to distortion prediction computation 1127 that generates a predicted likelihood of distortion associated with the acoustic output from speaker 1130B. Distortion prediction computation 1127 can be realized as one or more computational circuits for machine learning, statistical learning, predictive learning, or AI-based measure that can provide computation of the likelihood of distortion at loudspeaker output 1130B. Conventional circuits for such learning and AI techniques can be used. These circuits may include various types of memory devices and one or more processors, DSPs, ASICs and other computational devices. The predicted likelihood of distortion can be output from sensing circuitry 1110B to a dynamic gain cell.

Figure 13:
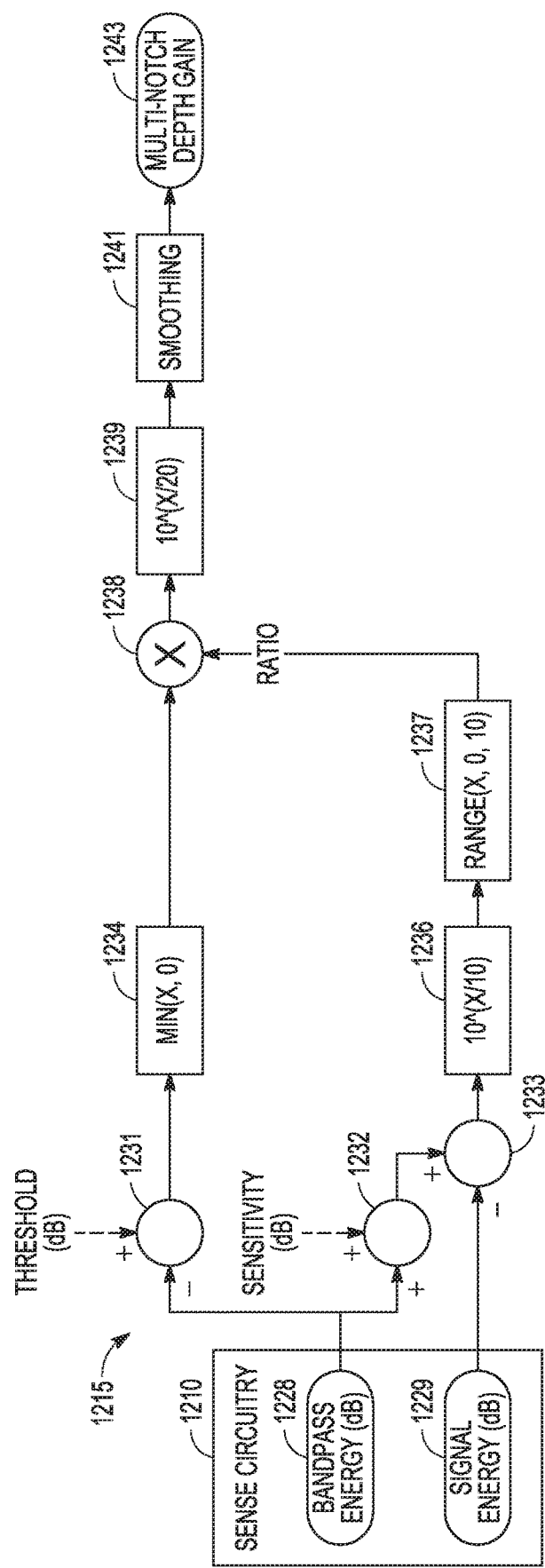
FIG. 13 is a block diagram of an example dynamic gain control that adjusts depths of notches using measured distortion sense energy, in accordance with various embodiments.

A dynamic gain cell, such as dynamic gain cell 315 of FIG. 4, dynamic gain cell 415 of FIG. 5, or similar dynamic gain cell, can variably engage a multi-notch filter such as multi-notch filter 305 of FIG. 4, multi-notch filter 405 of FIG. 5, or similar multi-notch filter, applied to the loudspeaker signal path to reduce rub and buzz or other objectionable distortion, as shown in FIG. 13. In various embodiments, a goal is to only engage the multi-notch filter when distortion would otherwise be activated so that there is minimum impact to the perceived timbre when listening to the loudspeaker system. Similarly to a dynamic range compressor, the sense analysis estimate of distortion activating energy can be compared to a tunable threshold such that when the estimate exceeds the threshold an initial notch depth is determined. The initial notch depth can then be scaled based on the significance of the sense analysis estimate to the total energy of the signal.

FIG. 13 is a block diagram of an embodiment of an example dynamic gain control 1215 that can adjust the depths of notches using the measured distortion sense energy as determined by sensing circuitry, for example in FIGS. 12A and 12B. When the distortion sense energy exceeds the threshold, the notches are engaged. Dynamic gain control 1215 includes inputs to receive a measure of bandpass energy 1228 and a measure of signal energy 1229 of sense circuitry 1210. The measure of bandpass energy 1228 can be passed to a comparator 1231 that can generate a difference between a threshold (dB) and the measure of measure of bandpass energy 1228. The threshold is a parameter that provides a threshold of distortion activating energy at which the multi-notch filter will begin to engage. The output, x, of comparator 1231 can be input to a comparator 1234 that selects the minimum of x and zero. The output of comparator 1234 is input to multiplier 1238.

The measure of bandpass energy 1228 can also be passed to an adder 1232 that can add sensitivity (dB) to the measure of bandpass energy 1228. The measure of bandpass energy 1228 with the added sensitivity can be passed from adder 1232 to comparator 1233 that can generate a difference between the measure of bandpass energy 1228 with the added sensitivity and the measure of signal energy 1229. The output of comparator 1233 can be converted from dB to a linear measure by converter 1236, the output of which is provided to a range [x, 0, 10] 1237, which provides a ratio to multiplier 1238. Range [x, 0, 10] clamps the value of output x to a range between 0 and 10. It performs a function to give output x: the value of 0, if x is less than zero, the value of 1, if x is greater than 10, and the value of x, if x is greater than or equal to zero and less than or equal to 10. A sensitivity parameter can be used to adjust the sensitivity and range of the dynamic ratio from range [x, 0, 10] 1237. The ratio from range [x, 0, 10] 1237 is multiplied with the output of comparator 1234 and applied to a decibel to linear converter 1239. A smoothing operator 1241 can be applied to the output of converter 1239. From the smoothing operator 1241, a multi-notch depth gain 1243 can be provided by dynamic gain control 1215.

Although this is somewhat similar to a compressors ratio control, a compressor ratio is usually static and limited to gain reduction ratios ranging from 1:1 to infinity:1. The dynamic gain cell, having dynamic gain control 1215 for example, can also apply an inverse ratio, meaning that the multi-notch filter depth can be greater than the difference between the distortion activating energy and the threshold parameter. The dynamic cell also provides smoothing parameters to mitigate multi-notch filter depth modulation artifacts. Other parameters, which can be used with respect to dynamic gain control, can include mode, attack time, release time, and attack threshold. Mode relates to whether the dynamic gain control statically and fully engages the multi-notch filter or dynamically and variably applies the multi-notch filter. Attack time is the speed at which the notch will engage. Release time is the speed at which the notch will disengage. Attack threshold is the amount of differential notch depth engagement required for attack time ballistic to be used. The ratio of combined bandpass energy to the total channel energy measured in the sense module can be used to dynamically adjust the depth of the multi-notch filter.

Figure 14:
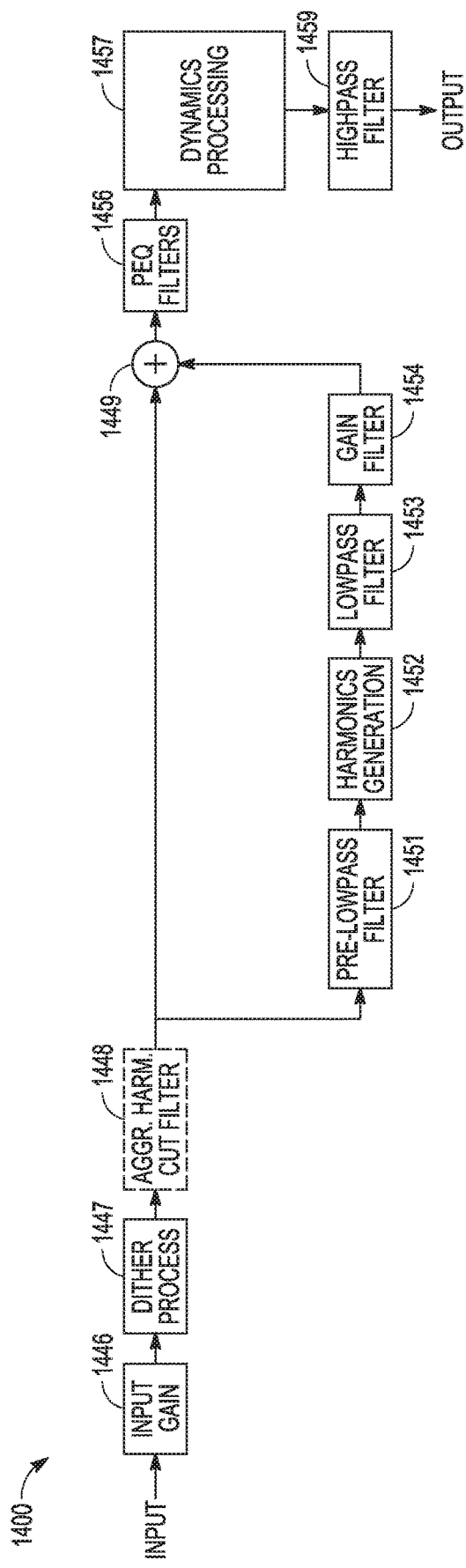
FIG. 14 is a block diagram of bass enhancement circuitry, in accordance with various embodiments.

FIG. 14 is a block diagram of bass enhancement circuitry 1400. Bass enhancement circuitry 1400 can be implemented by one or more processors and memory having instructions for bass enhancement. The one or more processors can be implemented as ASICs, DSPs, or combinations thereof. In general, bass enhancement has two main functions: increase amplitude of the bass frequency range, and insert harmonics. Bass enhancement circuitry 1400 can include an input gain 1446 that operates on a received audio signal input. The output of input gain 1446 can be input to a dither process 1447. The output of dither process 1447 may be input to an aggressive harmonic cut filter 1448, which may be disabled if desired. The output of aggressive harmonic cut filter 1448 may be directed into two paths. The output of aggressive harmonic cut filter 1448 may be coupled to a summer 1449. The output of aggressive harmonic cut filter 1448 may also be coupled to a pre-lowpass filter 1451.

The output of pre-lowpass filter 1451 can be coupled to a harmonics generation 1452. The output of harmonics generation 1452 can be coupled to a lowpass filter 1453, whose output can optionally be operated on by a gain filter 1454. The lowpass filter 1453 or the output of gain filter 1454, if implemented, can be coupled to summer 1449. Summer 1449 can add the output of aggressive harmonic cut filter 1448 (or output of dither process 1447 if aggressive harmonic cut filter 1448 is disabled) with the output of lowpass filter 1453 or the output of gain filter 1454, if implemented.

The output of summer 1449 can be coupled to parametric equalizer (PEQ) filters 1456. The output of PEQ filters 1456 can be coupled to a dynamic processing module 1457. Dynamic processing module 1457 may include a shelving filter, whose output can be operated on by a makeup gain. The output of Dynamic processing module 1457 can be coupled to a highpass filter 1459. Highpass filter 1459 can provide an output that is an audio signal directed along a path to a speaker (not shown in FIG. 14).

Harmonics generation 1452 can use an aggressive nonlinearity. For such a harmonics generation, a lowpass filter 1451 can be inserted preceding harmonics generation 1452, which can avoid harmonic generation from higher frequency components. Since lowpass filter 1451 is disposed preceding harmonics generation 1452, it may be referred to as pre-lowpass filter 1451. Pre-lowpass filter 1451 may have an adjustable cut-off frequency. Pre-lowpass filter 1451 can be an eighth order filter, which may have coefficients for a single second-order section, which can be repeated four times per block to achieve an eighth order transfer function. The cutoff frequency of the individual second-order section can be fixed, and thus four copies of this second-order section yields a frequency response with four times the gain.

Harmonic generation 1452 can adopt an aggressive nonlinearity in order to generate a richer spectrum of harmonics. A number of different nonlinearities and harmonic generation methods familiar in the art may be selected to generate harmonics. Higher gain and wider bandwidth can be provided to compensate for increased energy in the low-midband region. In order to compensate for the increased harmonic energy in the low-midband region inserted by the updated nonlinearity in harmonic generation 1452, the height and width of the PEQ filters 1456 in the low band region can be increased to provide an improved sense of depth relative to the increased low-midband energy. The bass level adjusts equalization applied to harmonics and mix. Additionally, PEQ Filters 1456 may be selected and tuned to enhance the low-frequency region according to techniques familiar in the art, wherein the magnitude and band-width of the low-frequency enhancement is adjustable.

Input gain 1446 can provide a gain to the audio signal being input, if the process is enabled. This gain can serve as a headroom gain for the process that can be set between two selected gain levels. Headroom allows for internal signals not to overshoot or undershoot the maximum values or minimum values supported in a processing module. Once the input gain has been applied, an algorithm checks the dither state that can be set by a silence detector called in an algorithm before the input gain is applied. If silence has been detected, then dither can be added to the signal. The dither may be only added to the analysis chain of the algorithm and it aids the dynamics processing applied later to minimize ramping-up effects that can be noticed when there is a switch between silent and signal segments.

After the input gain and dither stages, the main process can be called for processing. If, on the other hand the process is bypassed (not shown in FIG. 14), then the signal is first delayed by an amount equal to the delay introduced by the algorithm when the process is enabled, and then a gain equal to the bypass gain is applied to the signal. The delay introduced in the bypass path results in minimizing the effect of noticeable discontinuities between on and off states of the algorithm and vice versa.

Harmonics generation 1452 of the main process monitors the signal and computes how much headroom is available. This can be performed by finding the maximum values of both L and R channels on a block-per-block basis. These maxima are stored in a statistics history buffer of a selected length, and they can be averaged to give an average maximum per channel over a history of buffers of the selected length.

Lowpass filter 1453 serves to limit the highest frequency of harmonic content injected, and the generated harmonics can optionally be processed by additional filter, gain filter 1454, with low-pass gain characteristics. This can be performed in order to shape the generated harmonics, and give more emphasis to the lower harmonics.

Once the PEQ filters 1456 have been applied to the signal, dynamics processing 1457 can be applied, which can include applying make-up gain over the full frequency range of the signal. A preprocessing function can be called that computes the maximum value of the enhanced signal for both L and R channels. In addition, the preprocessing function can find the number of peaks of the signal that are above a threshold. The preprocessing function can manage look-ahead buffers used for the protected gain applied to the signal in the next stage of the process. A number of dynamics processing techniques familiar in the art can be implemented. The make-up gain provided by this dynamics processing is adjustable.

Boost that can be applied to the signal can be increased or decreased in a step-wise manner based on all the checks described previously. The maximum boost that can be applied can be computed based on an exposed control. Dynamic processing can be used internally to drive a gain line equation that yields the maximum book allowed for a given dynamics setting. This maximum can be compared to the available headroom computed. In other words, the maximum boost to be applied does not exceed the available headroom computed earlier. Further, in various embodiments, the maximum gain that is applied is not greater than the inverted, tracked average maximum value of the signal and, correspondingly, the boost applied is not greater than that maximum gain. The dynamics processing can dynamically adjust the amount of gain added to the signal based on the dynamics of the signal. In other words, the stronger the signal, the less gain is added to it.

After the dynamics processing 1457 is applied, the signal can go through a high-pass filter 1459. The order of the high-pass filter 1459 can vary, for example, from 1 to 8. The cutoff frequency of high-pass filter 1459 can be a user-exposed control, and can be tuned to reduce the signal energy below the speaker size setting. If a high-pass filter is applied outside bass enhancement circuitry 1400, then the high-pass filter 1459 can be disabled.

Figure 15:
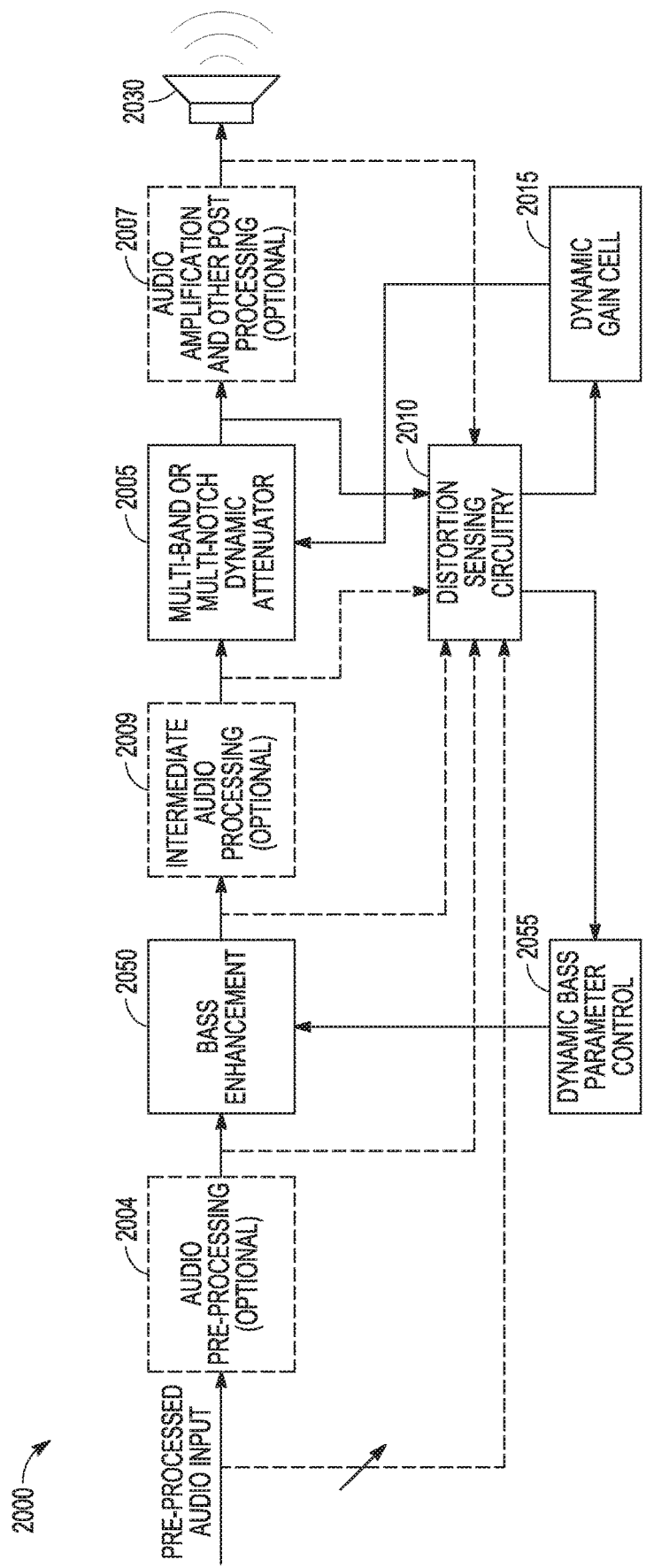
FIG. 15 is a block diagram of a system having dynamic multi-feature distortion sensing and adaptive, multi-band distortion reduction integrated with distortion-aware harmonic bass enhancement for an audio signal, in accordance with various embodiments.

FIG. 15 is a block diagram of an embodiment of an example system 2000 having dynamic multi-feature distortion sensing and adaptive, multi-band distortion reduction integrated with distortion-aware harmonic bass enhancement for an audio signal. System 2000 can include a bass enhancement 2050, a multi-band or multi-notch dynamic attenuator 2005, distortion sensing circuitry 2010, a dynamic gain cell 2015, and a dynamic bass parameter control 2055 operable with a speaker 2030 that provides acoustic output. Speaker 2030 can be realized as a micro-loudspeaker. Dynamic bass parameter control 2055 may modify one of more of adjustable bass enhancement parameters, which may be taken from the following non-exhaustive list:

1. Peak amplitude of the swept-tone envelope response of the bass enhancement module, which can be provided as the magnitude of PEQ Filters 1456,
2. Center frequencies of PEQ Filters 1456,
3. Bandwidths of PEQ Filter 1456,
4. Amount of harmonic energy inserted by the bass enhancement module, inch may be implemented as an adjustable gain to summation 1449,
5. Cutoff frequency of pre-lowpass filter 1451, which can provide the maximum frequency of energy provided to harmonics generation 1452,
6. Cutoff frequency of lowpass filter 1453, which can provide the maximum frequency of the harmonic energy injected to the bass-enhanced signal by summation 1449,
7. Threshold value(s) employed in the nonlinearity of the harmonics generation 1452,
8. Ratio of odd to even-order harmonics inserted by harmonics generation 1452,
9. Gain of dynamics processing 1457, and/or
10. Slope of the harmonics inserted by harmonics generation 1452.

System 2000 may optionally include audio pre-processing 2004 that can operate on a preprocessed audio input. The output from audio pre-processing 2004 can be input to bass enhancement 2050, whose output may be optionally processed by an intermediate audio processing 2009 prior to input to multi-band or multi-notch dynamic attenuator 2005. Output from multi-band or multi-notch dynamic attenuator 2005 can be coupled to distortion sensing circuitry 2010 and coupled to a path to speaker 2030. Optionally, prior to speaker 2030, the output from multi-band or multi-notch dynamic attenuator 2005 can be processed by audio amplification and other post-processing. The audio amplification and other post-processing can include speaker excursion protection, bass boost, digital-to-analog conversion, and analog gain.

Distortion sensing circuitry 2010 can be arranged in a number of ways. Sensing circuitry 2010 can be operable to generate statistics that measure a likelihood of distortion, or the degree of perceptible, objectionable, or measurable distortion, at an output of speaker 2030, as taught herein. Distortion sensing circuitry 2010 may either draw its single input signal from the variety of points in the signal serial chain, or draw multiple input signals from various points in the signal serial chain. With multiple input signals to distortion sensing circuitry 2010, distortion sensing circuitry 2010 can include a multivariate statistical or multivariate machine learning regression mechanism to determine the output of the distortion sensing circuitry 2010.

Distortion sensing circuitry 2010 can be structured as operable to compute a measure of a likelihood of distortion, or the degree of perceptible, objectionable, or measurable distortion, at an output of the speaker using a technique selected from a group including machine learning, statistical learning, predictive learning, and artificial intelligence (AI). The technique can use one or more procedures selected from a group including classification and regression trees (a.k.a decision trees), ordinary least squares regression, weighted least squares regression, support vector regression, an artificial neural network, piecewise-linear regression, ridge regression, lasso regression, elastic-net regression, and non-linear regression. The artificial neural network can include, but is not limited to, perceptron, multilayer perceptron, deep belief networks, and deep neural networks. Nonlinear regression can include, but is not limited to, polynomial regression.

Distortion sensing circuitry 2010 can be structured to be operable to compute a binary indicator of the distortion at an output of the speaker using a technique selected from a group including machine learning, statistical learning, predictive learning, or artificial intelligence. The technique can use one or more procedures selected from a group including classification and regression trees, support vector machines, artificial neural networks, logistic regression, naïve Bayes classification, linear discriminant analysis, and random forests. Support vector machines can include support vector classification. The artificial neural network can include, but is not limited to, perceptron, multilayer perceptron, deep belief networks, and deep neural networks.

Sensing circuitry 2010 can be structured to be operable to compute a binary indicator via derivation from a soft indicator by use of a threshold or comparator device. Alternatively, a semi-binary or semi-hard indicator may be derived from a soft indicator by use of a threshold, thereby yielding a discrete indication for input values above/below a certain threshold, and a variable indication for input values below/above a certain threshold. In the case of a binary or semi-binary indicator derived in this manner, hysteresis may be employed to avoid issuing a discrete indication for only brief excursions of the soft indicator past the threshold value(s).

Dynamic gain cell 2015 can be coupled to receive the output of distortion sensing circuitry 2010 and coupled to multi-band or multi-notch dynamic attenuator 2005 to operatively provide parameters or control signals to modify the attenuation by multi-band or multi-notch dynamic attenuator 2005. An output of distortion sensing circuitry 2010 can be input to dynamic bass parameter control 2055, which can provide an input to bass enhancement 2050 to adjust or modify bass enhancement parameters in bass enhancement 2050.

Dynamic bass parameter control 2055 can dynamically modify a number of bass enhancement parameters. The number of bass enhancement parameters may be selected from a group of parameters that can include peak amplitude of a swept-tone envelope response of the bass enhancement 2050, which may be manifested by a "bump" around the bass frequency region being amplified, a center frequency of the bass frequency region being amplified, a frequency width of the bass frequency region being amplified, an amount of harmonic energy inserted by the bass enhancement 2050, a maximum order of harmonic inserted by the bass enhancement 2050, a maximum frequency of harmonic energy inserted by the bass enhancement 2050, a shape of the successive harmonics inserted by the bass enhancement 2050 including slope of the successive harmonics inserted by bass enhancement 2050, a ratio of even-order to odd-order harmonics inserted by bass enhancement 2050, or any linear or nonlinear cross-fading characteristic curve which adjusts all of the above parameters from a relative "low bass" setting to a "high bass" setting.

Figure 16:
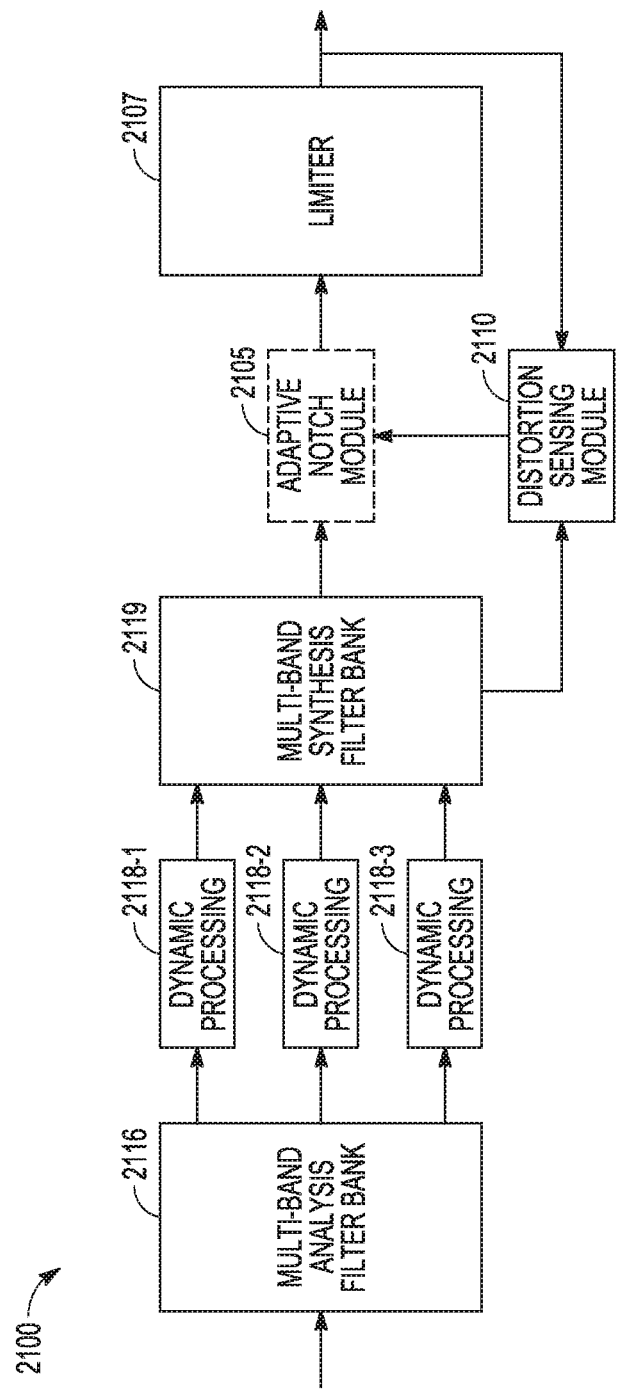
FIG. 16 is a block diagram of an example adaptive, dynamic, sensing and multi-notch module, in accordance with various embodiments.

A number of variations in architectures for distortion sensing and distortion reduction and architecture for distortion-aware harmonic bass enhancement can be implemented. FIG. 16 is a block diagram of an embodiment of an example sensing and multi-notch module 2100 that is adaptive and dynamic. Sensing and multi-notch module 2100 can include a multi-band analysis filter bank 2116 that receives an audio signal and provides outputs to each of dynamics processing 2118-1, dynamics processing 2118-2, and dynamics processing 118-3. A multi-band analysis filter bank, like a multi-band analysis filter bank 2116, can break down an input signal into different spectral ranges, for example, a low frequency band, a mid frequency band, a high frequency band. A dynamics module is basically a form of dynamic compression processing that can be conducted on a selected frequency range. Outputs of each of dynamics processing 2118-1, dynamics processing 2118-2, and dynamics processing 2118-3 can input to multi-band synthesis filter bank 2119. Multi-band synthesis filter bank 2119 can provide an input to adaptive notch module 2105 that provides a filter processed audio signal to a limiter 2107 to provide a signal for an acoustic output.

Multi-band synthesis filter bank 2119 can also provide an input to distortion sensing module 2110. Distortion sensing module 2110 can also receive feedback from limiter 2107. The signals from limiter 2107 and multi-band synthesis filter bank 2119 can be used by distortion sensing module 2110 to determine distortion and generation parameters for input to adaptive notch module 2105 to reduce distortion. Distortion sensing module 2110 and adaptive notch module 2105 can include functionality to perform operations similar or identical to functions and/or features of notch filters and sensing circuitry associated with FIGS. 3-14.

Figure 17:
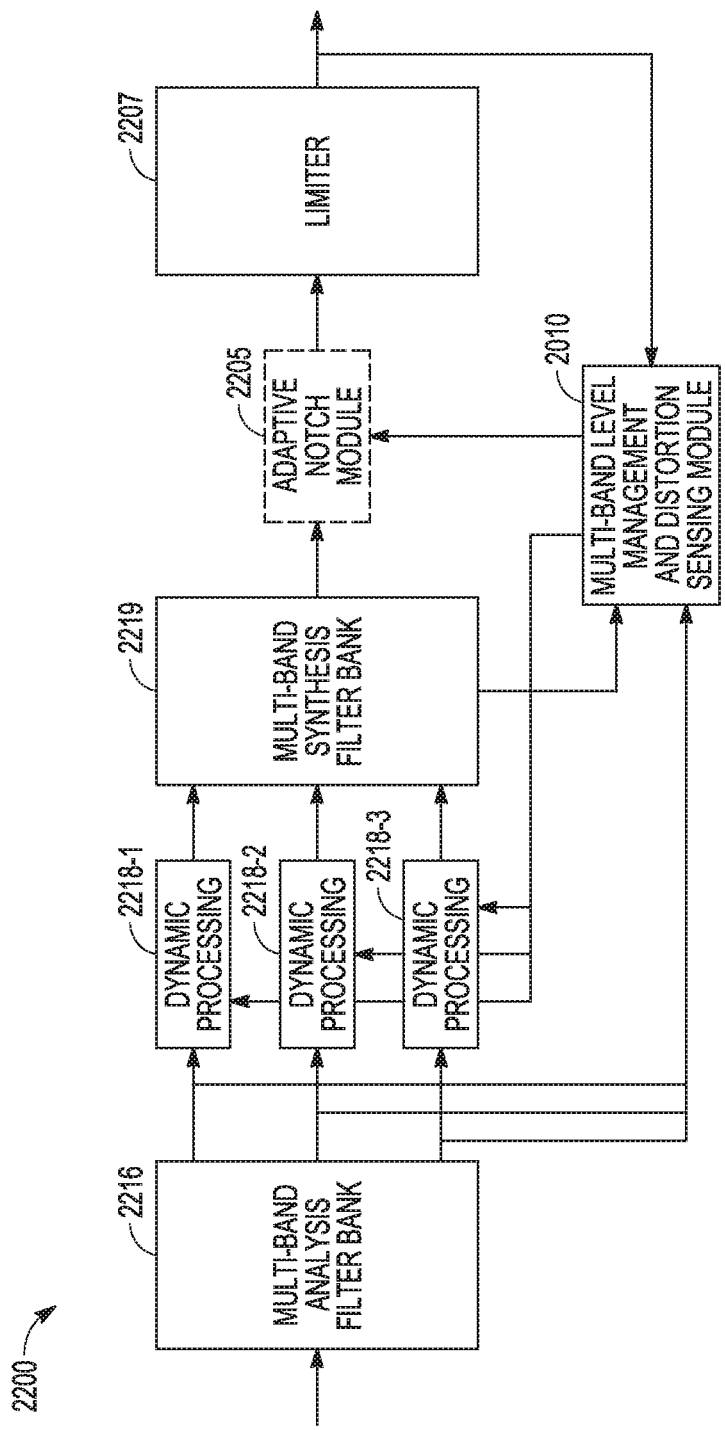
FIG. 17 is a block diagram of an example adaptive, dynamic, sensing and multi-notch module, in accordance with various embodiments.

FIG. 17 is a block diagram of an embodiment of an example sensing and multi-notch module 2200 that is adaptive and dynamic. Sensing and multi-notch module 2200 can include a multi-band analysis filter bank 2216 that receives an audio signal and provides outputs to each of dynamics processing 2218-1, dynamics processing 2218-2, and dynamics processing 2218-3. Outputs of each of dynamics processing 2218-1, dynamics processing 2218-2, and dynamics processing 2218-3 can be input to multi-band synthesis filter bank 2119. Multi-band synthesis filter bank 2219 can provide an input to adaptive notch module 2205 that provides a filter processed audio signal to a limiter 2207 to provide a signal for an acoustic output.

Multi-band synthesis filter bank 2219 can also provide an input to a multi-band level management and distortion sensing module 2210. Multi-band level management and distortion sensing module 2210 can also receive the outputs from multi-band analysis filter bank 2216 that are directed to each of dynamics processing 2218-1, dynamics processing 2218-2, and dynamics processing 2218-3. In addition, multi-band level management and distortion sensing module 2210 can receive feedback from limiter 2207. The signals from limiter 2207, multi-band synthesis filter bank 2219, and the outputs of from multi-band analysis filter bank 2216 can be used by multi-band level management and distortion sensing module 2210 to determine distortion and generation parameters for input to adaptive notch module 2205 to reduce distortion. In addition, multi-band level management and distortion sensing module 2210 can use these inputs to provide parameters for dynamics processing 2218-1, dynamics processing 2218-2, and dynamics processing 2218-3. Multi-band level management and distortion sensing module 2210 and adaptive notch module 2205 can include functionality to perform operations similar or identical to functions and/or features of notch filters and sensing circuitry associated with FIGS. 3-16.

Figure 18:
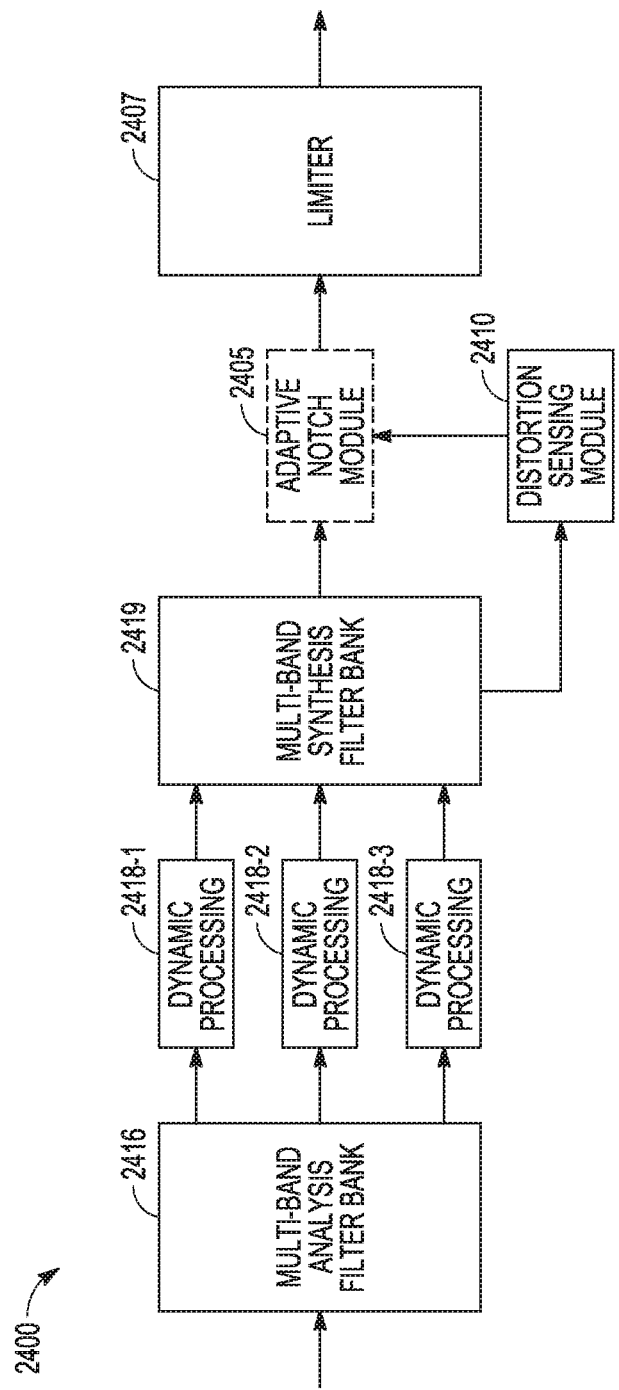
FIG. 18 is a block diagram of an example adaptive, dynamic, sensing and multi-notch module, configured in a feed-forward arrangement, in accordance with various embodiments.

FIG. 18 is a block diagram of an embodiment of an example sensing and multi-notch module 2400 that is adaptive and dynamic. Sensing and multi-notch module 2400 can include a multi-band analysis filter bank 2416 that receives an audio signal and provides outputs to each of dynamics processing 2418-1, dynamics processing 2418-2, and dynamics processing 2418-3. Outputs of each of dynamics processing 2418-1, dynamics processing 2418-2, and dynamics processing 2418-3 are input for multi-band synthesis filter bank 2419. Multi-band synthesis filter bank 2419 can provide an input to adaptive notch module 2405 that provides a filter processed audio signal to a limiter 2407 to provide a signal for an acoustic output.

Multi-band synthesis filter bank 2419 can also provide an input to distortion sensing module 2410. The signals from multi-band synthesis filter bank 2419 can be used by distortion sensing module 2410 to determine distortion and generation parameters for input to adaptive notch module 2405 to reduce distortion. In this architecture, a signal from limiter 2407 is not feedback to distortion sensing module 2410. Distortion sensing module 2410 and adaptive notch module 2405 can include functionality to perform operations similar or identical to functions and/or features of notch filters and sensing circuitry associated with FIGS. 3-17.

Figure 19:
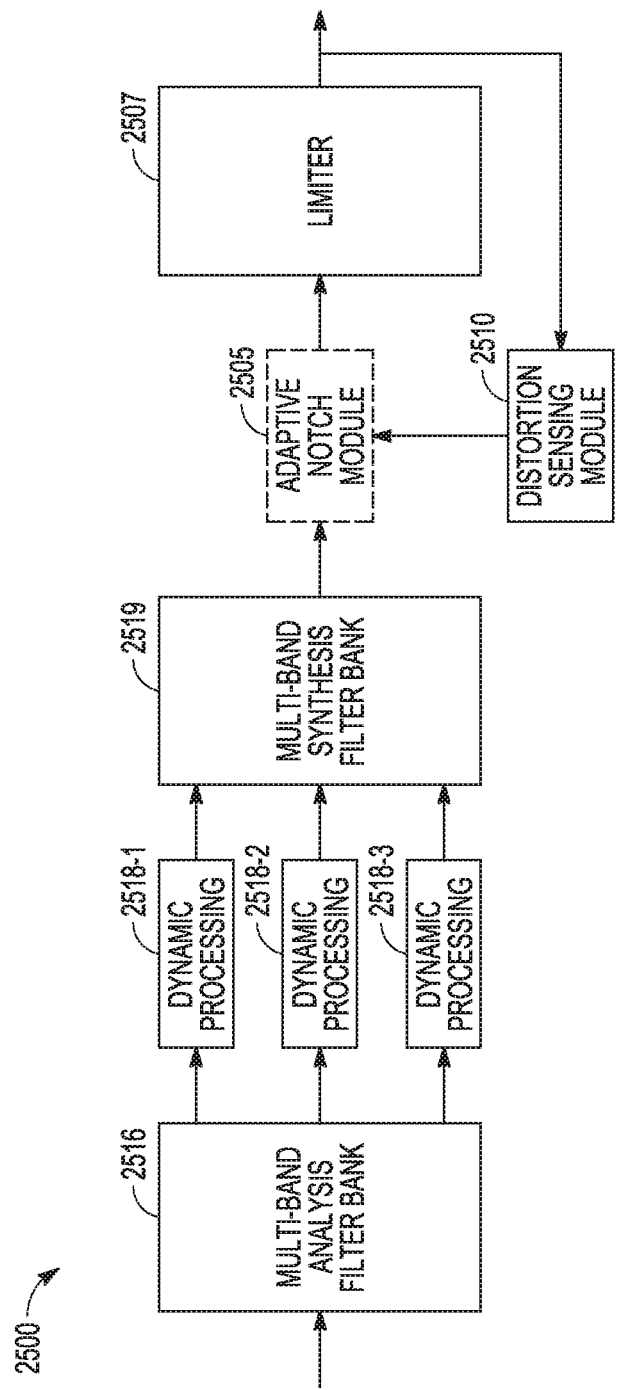
FIG. 19 is a block diagram of an example adaptive, dynamic, sensing and multi-notch module, configured in a feed-back arrangement, in accordance with various embodiments.

FIG. 19 is a block diagram of an embodiment of an example sensing and multi-notch module 2500 that is adaptive and dynamic. Sensing and multi-notch module 2500 can include a multi-band analysis filter bank 2516 that receives an audio signal and provides outputs to each of dynamics processing 2518-1, dynamics processing 2518-2, and dynamics processing 2518-3. Outputs of each of dynamics processing 2518-1, dynamics processing 2518-2, and dynamics processing 2518-3 are input for multi-band synthesis filter bank 2519. Multi-band synthesis filter bank 2519 can provide an input to adaptive notch module 2505, where notch module 2505 provides a filter processed audio signal to a limiter 2507 to provide a signal for an acoustic output.

The output of limiter 2507 can also be fed back to a distortion sensing module 2510. The feedback signal from limiter 2507 can be used by distortion sensing module 2510 to determine distortion and generation parameters for input to adaptive notch module 2505 to reduce distortion. Distortion sensing module 2510 and adaptive notch module 2505 can include functionality to perform operations similar or identical to functions and/or features of notch filters and sensing circuitry associated with FIGS. 3-18.

Figure 20:
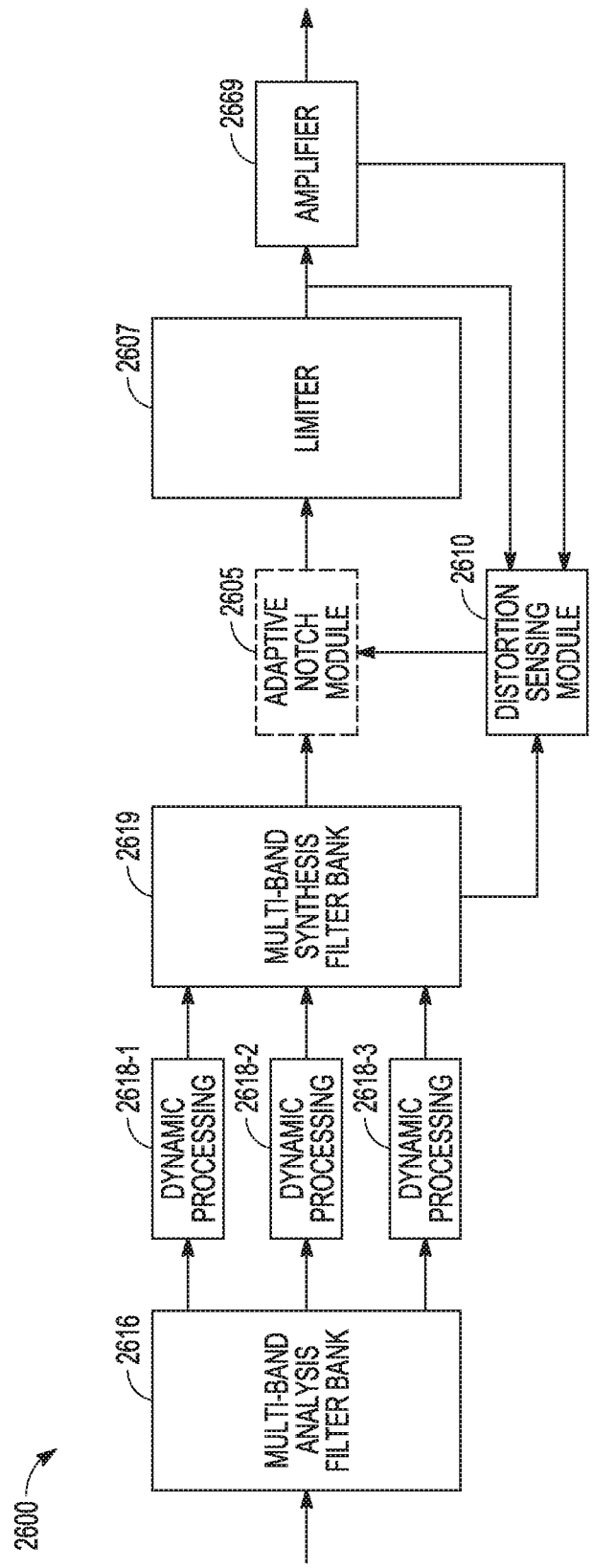
FIG. 20 is a block diagram of an example adaptive, dynamic, sensing and multi-notch module, incorporating both feed-forward and feed-back audio signals to sense the likelihood of distortion, or the degree of objectionable, perceptible, or measurable distortion, along with feedback information derived from or equivalent to real-time voltage and/or current sensing information from external transducer amplifier circuitry, in accordance with various embodiments.

FIG. 20 is a block diagram of an embodiment of an example sensing and multi-notch module 2600 that is adaptive and dynamic. Sensing and multi-notch module 2600 can include a multi-band analysis filter bank 2616 that receives an audio signal and provides outputs to each of dynamics processing 2618-1, dynamics processing 2618-2, and dynamics processing 2618-3. Outputs of each of dynamics processing 2618-1, dynamics processing 2618-2, and dynamics processing 2618-3 are input for multi-band synthesis filter bank 2619. Multi-band synthesis filter bank 2619 can provide an input to adaptive notch module 2605 that provides a filter processed audio signal to a limiter 2607. The output of limiter 2607 can be input to an amplifier 2669 whose output provides a signal for an acoustic output.

Multi-band synthesis filter bank 2619 can also provide an input to distortion sensing module 2610. Distortion sensing module 2610 can also receive feedback from limiter 2607 and feedback from amplifier 2669. The signals from amplifier 2669, limiter 2607, and multi-band synthesis filter bank 2619 can be used by distortion sensing module 2610 to determine distortion and generation parameters for input to adaptive notch module 2605 to reduce distortion. Distortion sensing module 2610 and adaptive notch module 2605 can include functionality to perform operations similar or identical to functions and/or features of notch filters and sensing circuitry associated with FIGS. 3-19.

Figure 21:
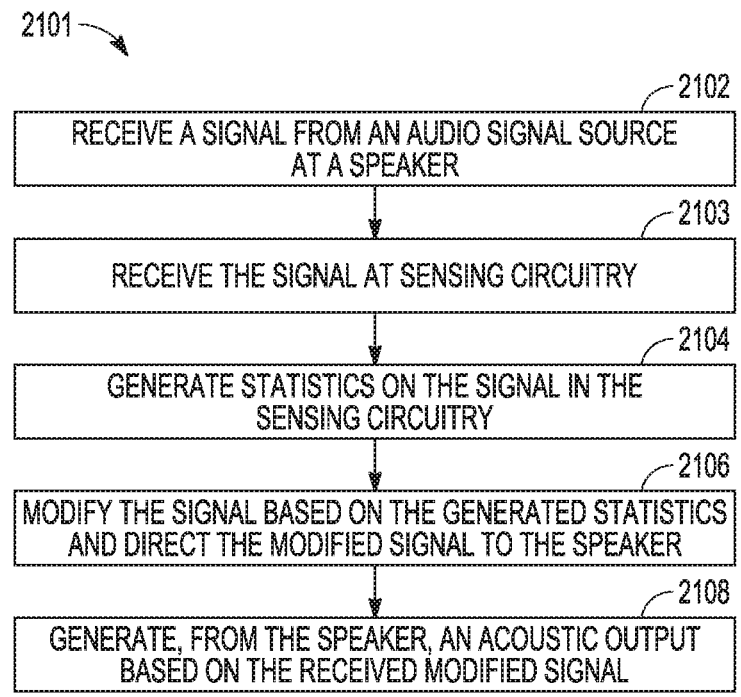

FIG. 21 is a flow diagram of features of an embodiment of an example method 2101 of sensing distortion and reducing the distortion for acoustic output generated from a speaker. At 2102, a signal from an audio signal source is received at a speaker. At 2103, the signal is received at sensing circuitry. At 2104, statistics on the signal are generated in the sensing circuitry. Generating statistics on the signal in the sensing circuitry can be implemented in a digital signal processor. Generating statistics can include generating statistics that measure a likelihood of distortion at an output of the speaker or measure a degree of objectionable, perceptible, or measurable distortion at an output of the speaker.

At 2106, the signal is modified based on the generated statistics and directing the modified signal to the speaker. At 2108, an acoustic output, based on the received modified signal, is generated from the speaker.

Variations of method 2101 or methods similar to method 2101 can include a number of different embodiments that may be combined depending on the application of such methods and/or the architecture of the systems in which such methods can be implemented. Such methods can include computing, in the sensing circuitry, a binary indicator of the distortion at an output of the speaker using a technique selected from a group including machine learning, statistical learning, predictive learning, or artificial intelligence. Using the technique includes using one or more procedures selected from a group including classification and regression trees, support vector machines, artificial neural networks, logistic regression, naïve Bayes classification, linear discriminant analysis, and random forests. Variations of method 2101 or methods similar to method 2101 can include computing, in the sensing circuitry, a soft indicator corresponding to a likelihood of distortion or a degree of objectionable, perceptible, or measurable distortion at an output of the speaker using a technique selected from a group including machine learning, statistical learning, predictive learning, and artificial intelligence.

Variations of method 2101 or methods similar to method 2101 can include generating statistics on the signal in the sensing circuitry to include using sensing circuitry having multiple infinite impulse response (IIR) or finite impulse response (FIR) band-pass filters, and/or dynamic spectrum analysis filters, tuned to frequencies determined to contribute to distortion for the speaker. Such methods can include estimating, in the sensing circuitry, an amount of distortion activating energy in a filtered signal from the multiple HR or FIR band-pass filters, and/or dynamic spectrum analysis filters, as one or more statistics computed from energy across all bands of the multiple band-pass and/or dynamic spectrum analysis filters, and measuring total energy of the filtered signal. The one or more statistics can include one or more statistics from a group of statistics including a median, a mean, an arithmetic mean, a geometric mean, a maximum of the energy, a minimum of the energy, and energy of a nth largest energy among all band-pass energies computed with n being a selected positive integer. Variations of method 2101 or methods similar to method 2101 can include computing, in the sensing circuitry, energy as time-varying energy or computing an envelope of a full-band audio signal.

Figure 22:
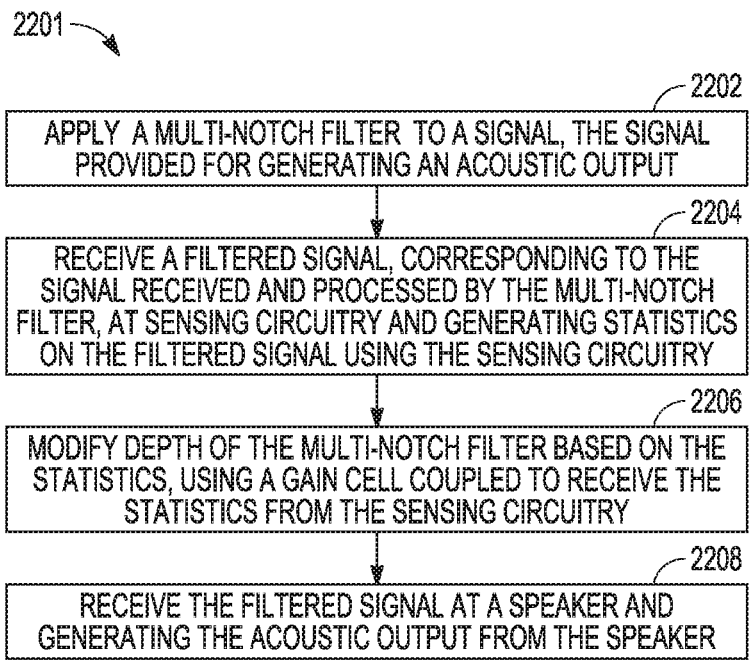
FIG. 22 is a flow diagram of features of an example method of sensing distortion and reducing the distortion for acoustic output generated from a speaker, in accordance with various embodiments.

FIG. 22 is a flow diagram of features of an embodiment of an example method 2201 of sensing distortion and reducing the distortion for acoustic output generated from a speaker. At 2202, a multi-notch filter is applied to a signal, where the signal is provided for generating an acoustic output. At 2204, a filtered signal, corresponding to the signal received and processed by the multi-notch filter, is received at sensing circuitry and statistics on the filtered signal are generated using the sensing circuitry. Generating statistics can include generating statistics that measure a likelihood of distortion at an output of the speaker. Using the sensing circuitry can include using multiple infinite impulse response (IIR) or finite impulse response (FIR) bandpass filters, and/or dynamic spectrum analysis filters, tuned to frequencies determined to contribute to distortion for the speaker. Using the sensing circuitry can include estimating amount of distortion activating energy in the filtered signal as a mean of energy across all bands of the multiple IIR or FIR bandpass filters and/or dynamic spectrum analysis filters, and measuring total energy of the filtered signal.

At 2206, depth of the multi-notch filter is modified based on the statistics, using a dynamic gain cell coupled to receive the statistics from the sensing circuitry. Using the dynamic gain cell an include providing a gain to adjust the depth of the multi-notch filter based on one or more statistics. Modifying depth of the multi-notch filter using a dynamic gain cell can include adjusting the depth of the multi-notch filter based on a ratio of the mean to the measured total energy. At

2208, the filtered signal is received at a speaker and the acoustic output is generated from the speaker. Receiving a filtered signal processed by the multi-notch filter, generating statistics on the filtered signal, and modifying the depth of the multi-notch filter can be implemented in a digital signal processor.

Variations of method 2201 or methods similar to method 2201 can include computing, in the sensing circuitry, the measure of the likelihood of distortion at the output of the speaker using a technique selected from a group including machine learning, statistical learning, predictive learning, and artificial intelligence. Such variations can include computing, in the sensing circuitry, a binary indicator of the distortion at the output of the speaker using a technique selected from a group including machine learning, statistical learning, predictive learning, or artificial intelligence.

Variations of method 2201 or methods similar to method 2201 can include applying the multi-notch filter to the signal to include providing the signal to the multi-notch filter as a bass processed signal resulting from processing by bass enhancement circuitry. Processing by bass enhancement circuitry can include generating statistics on the bass processed signal using the sensing circuitry; generating parameters based on the statistics on the bass processed signal; and using the parameters to provide bass enhancement for the signal applied to the multi-notch filter.

Figure 23:
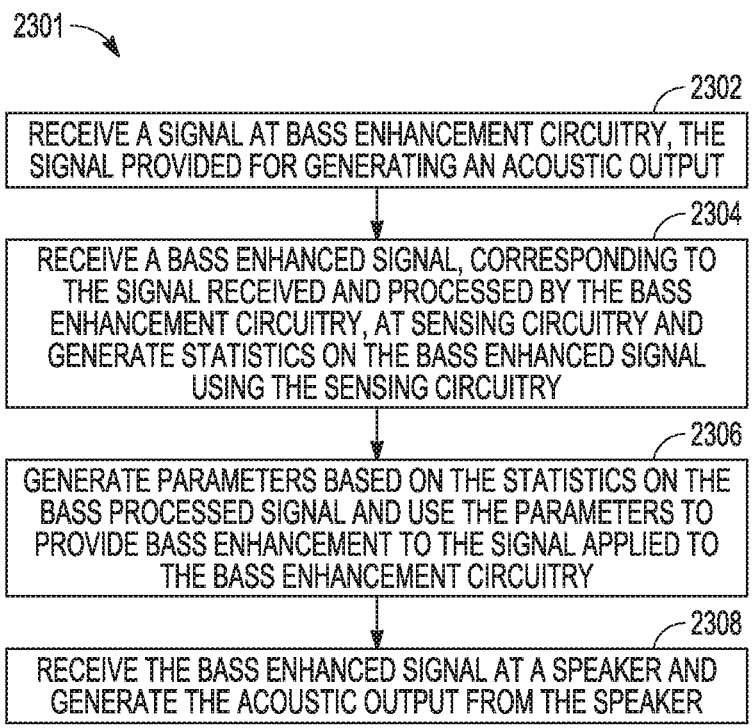
FIG. 23 is a flow diagram of features of an example method of implementing distortion-aware harmonic bass enhancement for audio signals, in accordance with various embodiments.

FIG. 23 is a flow diagram of features of an embodiment of an example method 2301 of implementing distortion-aware harmonic bass enhancement for audio signals. At 2302, a signal is received at bass enhancement circuitry, where the signal is provided for generating an acoustic output. At 2304, a bass enhanced signal, corresponding to the signal received and processed by the bass enhancement circuitry, is received at sensing circuitry and statistics on the bass enhanced signal is generated using the sensing circuitry. Processing by the bass enhancement circuitry can include performing one or more bass enhancements selected from a group including bass enhancement based on linear filtering and bass enhancement based on insertion and/or generation of additional harmonics of a signal bearing audio content. Processing by the bass enhancement circuitry can include using adaptive harmonic bass enhancement circuitry employing tunable asymmetric nonlinearity along with pre-cutoff filtering and post-cutoff filtering to vary an amount of harmonic energy added to the received signal. Generating statistics can include generating statistics that measure a likelihood of distortion at an output of the speaker, or a degree of objectionable, perceptible, or measurable distortion at an output of the speaker.

At 2306, parameters are generated based on the statistics on the bass processed signal and the parameters are used to provide bass enhancement to the signal applied the bass enhancement circuitry. Using the parameters to provide bass enhancement can include providing parameters to control bass amplitude and bass harmonic level. At 2308, the bass enhanced signal is received at a speaker and the acoustic output is generated from the speaker.

Variations of method 2301 or methods similar to method 2301 can include a number of different embodiments that may be combined depending on the application of such methods and/or the architecture of systems in which such methods are implemented. Variations of method 2301 or methods similar to method 2301 can include computing, in the sensing circuitry, a binary indicator of distortion at an output of the speaker using a technique selected from a group including machine learning, statistical learning, predictive learning, or artificial intelligence. Using the technique can include using one or more procedures selected from a group including classification and regression trees, support vector machines, artificial neural networks, logistic regression, naïve Bayes classification, linear discriminant analysis, and random forests.

Variations of method 2301 or methods similar to method 2301 can include computing, in the sensing a soft indicator corresponding to a likelihood of distortion or a degree of objectionable, perceptible, or measurable distortion at an output of the speaker using a technique selected from a group including machine learning, statistical learning, predictive learning, and artificial intelligence. Using the technique can include using one or more procedures selected from a group including classification and regression trees, ordinary least squares regression, weighted least squares regression, support vector regression, an artificial neural network, piecewise-linear regression, ridge regression, lasso regression, elastic-net regression, and nonlinear regression. Such methods can include deriving a binary indicator from the soft indicator by use of a threshold device or a comparator device.

Variations of method 2301 or methods similar to method 2301 can include using sensing circuitry having multiple infinite impulse response (IIR) or finite impulse response (FIR) band-pass filters, and/or dynamic spectrum analysis filters, tuned to frequencies determined to contribute to distortion for the speaker. Such methods can include estimating, in the sensing circuitry, an amount of distortion activating energy in a filtered signal from the multiple IIR or FIR band-pass filters, and/or dynamic spectrum analysis filters, as one or more statistics computed from energy across all bands of the multiple band-pass filters and/or dynamic spectrum analysis filters, and measuring total energy of the filtered signal. The one or more statistics can include one or more statistics from a group of statistics including is a median, a mean, an arithmetic mean, a geometric mean, a maximum of the energy, a minimum of the energy, and energy of a nth largest energy among all band-pass energies computed with n being a selected positive integer.

Figure 24:
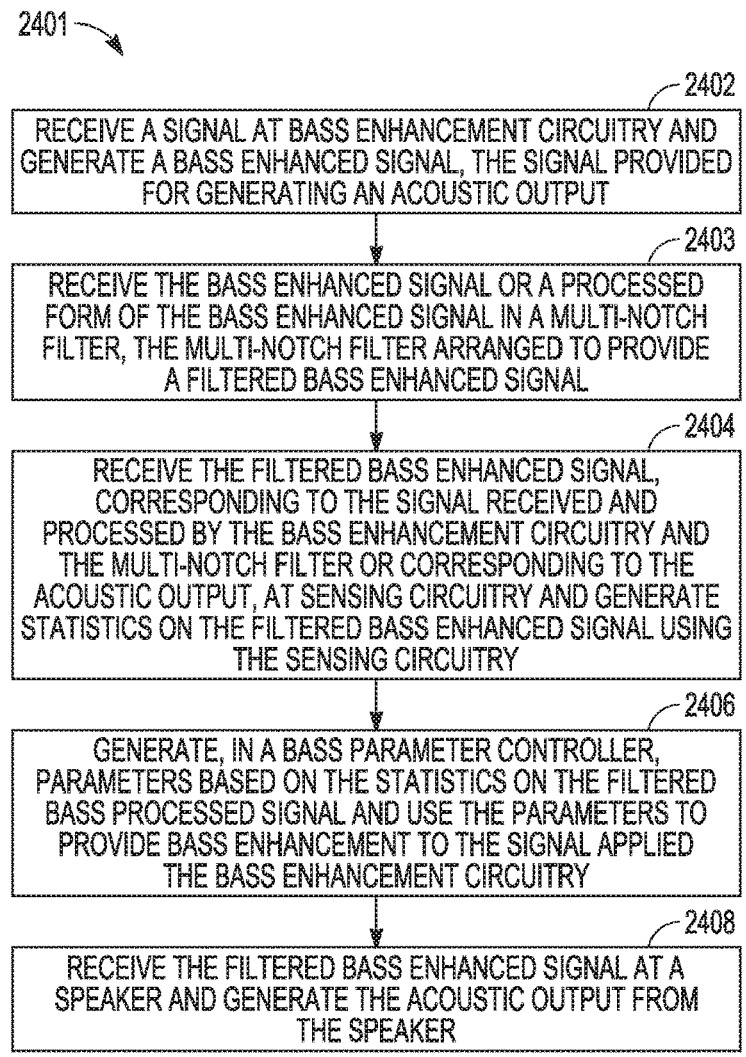
FIG. 24 is a flow diagram of features of an example method of implementing distortion sensing, distortion reduction, and distortion-aware harmonic bass enhancement for audio signals, in accordance with various embodiments.

FIG. 24 is a flow diagram of features of an embodiment of an example method 2401 of implementing distortion sensing, distortion reduction, and distortion-aware harmonic bass enhancement for audio signals. At 2402, a signal is received at bass enhancement circuitry and a bass enhanced signal is generated, the signal provided for generating an acoustic output. At 2403, the bass enhanced signal or a processed form of the bass enhanced signal is received in a multi-notch filter, the multi-notch filter arranged to provide a filtered bass enhanced signal. At 2404, the filtered bass enhanced signal, corresponding to the signal received and processed by the bass enhancement circuitry and the multi-notch filter or corresponding to the acoustic output, is received at sensing circuitry and statistics on the filtered bass enhanced signal are generated using the sensing circuitry. At 2406, in a bass parameter controller, parameters based on the statistics on the filtered bass processed signal are generated and the parameters are used to provide bass enhancement to the signal applied the bass enhancement circuitry. The statistics from the sensing circuitry can be received in a dynamic gain cell and depth of the multi-notch filter can be modified using the dynamic gain cell based on the received statistics. The filtered bass enhanced signal can be generated from the multi-notch filter having the modified depth. At 2408, the filtered bass enhanced signal is received at a speaker and the acoustic output is generated from the speaker.

Variations of method 2401 or methods similar to method 2401 can include a number of different embodiments that may be combined depending on the application of such methods and/or the architecture of the systems in which such methods can be implemented. Such methods can include operating the bass enhancement circuitry, sensing circuitry, bass parameter controller, the multi-notch filter, and the dynamic gain cell in a digital signal processor. Such methods can include amplifying and/or post-processing the output of the multi-notch filter and providing the amplified and/or post-processed output of the multi-notch filter to the speaker. Such methods may also include audio processing the bass enhanced signal and providing the audio processed bass enhanced signal to the multi-notch filter. Features of method 2401 can be combined with features of method 2101, 2201, or 2301. In addition, features, as taught herein, can be combined with method 2101, method 2201, method 2301, method 2401, combinations of method 2101, method 2201, method 2301, and method 2401, and variations thereof.

Figure 25:
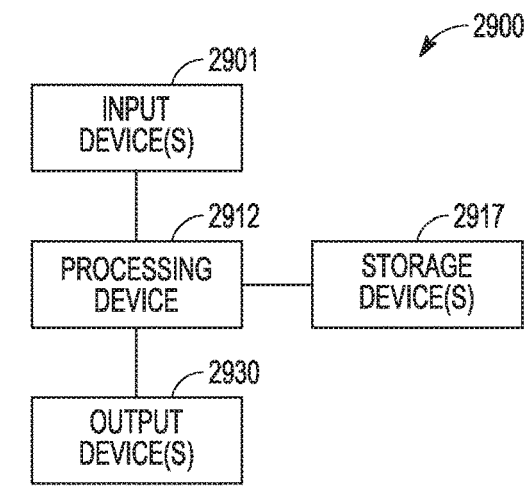
FIG. 25 is a block diagram of an example audio system arranged to operate with respect to distortion sensing and distortion reduction for acoustic output sensing distortion and reducing the distortion for acoustic output, in accordance with various embodiments.

FIG. 25 is a block diagram of an embodiment of an example audio system 2900 arranged to operate with respect to distortion sensing, prevention, and distortion-aware bass enhancement according to techniques as taught herein. Audio system 2900 can include an input device 2901 and a processing device 2912 operatively coupled to the input device 2901 to receive an input audio signal and to operate on the input audio signal to control generation of an acoustic output signal. Input device 2901 can include one or more sources of audio such as DVD player, blu-ray device, TV tuner, CD player, handheld player, internet audio/video, gaming console, or other device providing a signal for audio production. Input device 2901 may be a node or a set of nodes that provide a source of input for one or more signals to processing device 2912. The output audio signal may be transmitted to an audio output device 2925 such as speakers. The speakers may be stereo speakers, surround sound speakers, headset speakers, micro-loudspeakers, or other similar audio output device.

Processing device 2912 can be realized by a variety of machine instrumentalities to execute and/or control functions associated with operating on signals for audio production as taught herein. Such machine instrumentalities can include one or more devices such as, but not limited to, a general purpose processor, a computing device having one or more processing devices, a DSP, an ASIC, a field programmable gate array (FPGA) or other programmable logic device, discrete gate or transistor logic, discrete hardware components, or any combination thereof designed to perform the functions described herein. A general purpose processor and processing device can be a microprocessor, but in the alternative, the processor can be a controller, microcontroller, or state machine, combinations of the same, or the like. A processor can also be implemented as a combination of computing devices, such as a combination of a DSP and a microprocessor, a plurality of microprocessors, one or more microprocessors in conjunction with a DSP core, or any other such configuration. Processing device 2912 may be realized by a set of processing devices, where a set has one or more processing devices. The set of processing devices may include a set of integrated circuits. Processing device 2912 may be operatively coupled to one or more storage devices 2517 that store instructions and data for processing as taught herein. Storage devices 2517 can be realized by a number of machine-readable storage devices.

Processing device 2912 can be structured to apply a signal to a multi-notch filter, where the signal is provided for generating an acoustic output; receive a filtered signal, corresponding to the signal received and processed by the multi-notch filter, at sensing circuitry and generate statistics on the filtered signal using the sensing circuitry; modify depth of the multi-notch filter based on the statistics, using a dynamic gain cell coupled to receive the statistics from the sensing circuitry; and receive the filtered signal at a speaker and generating the acoustic output from the speaker. Generation of statistics can include generating statistics that measure a likelihood of distortion at an output of the speaker. Use of sensing circuitry can include using multiple infinite impulse response (IIR) or finite-impulse response bandpass filters; and/or dynamic spectrum analysis filters, tuned to frequencies determined to contribute to distortion for the speaker. Use of sensing circuitry can include estimation of an amount of distortion activating energy in the filtered signal as a mean of energy across all bands of the multiple IIR or FIR bandpass filters and/or dynamic spectrum analysis filters, and measuring total energy of the filtered signal.

In various embodiments processing device 2912 can be structured to apply the signal to the multi-notch filter as a bass processed signal resulting from processing by bass enhancement circuitry. The processing by bass enhancement circuitry can include operations to: generate statistics on the bass processed signal using the sensing circuitry; generate parameters based on the statistics on the bass processed signal; and use the parameters to provide bass enhancement for the signal applied to the multi-notch filter.

In various embodiments, processing device 2912 can be structured to receive a signal at bass enhancement circuitry, where the signal is provided for generating an acoustic output; receive a bass enhanced signal, corresponding to the signal received and processed by the bass enhancement circuitry, at sensing circuitry and generating statistics on the bass enhanced signal using the sensing circuitry; generate parameters based on the statistics on the bass processed signal and use the parameters to provide bass enhancement to the signal applied the bass enhancement circuitry; and receive the bass enhanced signal at a speaker and generate the acoustic output from the speaker. A set of parameters used to provide bass enhancement can include parameters to control bass amplitude and bass harmonic level. The generation of statistics can include generation of statistics that measure a likelihood of distortion at an output of the speaker.

The processing by the bass enhancement circuitry can include performing one or more bass enhancements selected from a group including bass enhancement based on linear filtering and bass enhancement based on insertion and/or generation of additional harmonics of a signal bearing audio content. The processing by the bass enhancement circuitry can include using adaptive harmonic bass enhancement circuitry employing tunable asymmetric nonlinearity along with pre-cutoff filtering and post-cutoff filtering to vary an amount of harmonic energy added to the received signal.

Processing device 2912 can be structured to provide distortion sensing, prevention, and/or distortion-aware bass enhancement. Processing device 2912 can includes features, as taught herein, and variations of these features to provide the functions for sensing distortion and reducing the distortion. Processing device 2912 can includes features, as taught herein, and variations of these features to provide the functions for distortion-aware bass enhancement. Combinations of features can be incorporated in processing device 2912.

According to various embodiments, a first example system can comprise: a speaker arranged to receive a signal from an audio signal source and to generate an acoustic output based on the received signal; and sensing circuitry coupled to receive the signal and to generate statistics on the signal to modify the signal received by the speaker.

Optionally, in accordance with the preceding first example system, another implementation provides that the sensing circuitry is implemented in a digital signal processor.

Optionally, in any of the preceding examples in accordance with the first example system, a further implementation provides that the sensing circuitry can be operable to generate statistics that measure a likelihood of distortion at an output of the speaker or measure a degree of objectionable, perceptible, or measurable distortion at an output of the speaker.

Optionally, in any of the preceding examples in accordance with the first example system, a further implementation provides that the sensing circuitry can be operable to compute a binary indicator of the distortion at an output of the speaker using a technique selected from a group including machine learning, statistical learning, predictive learning, or artificial intelligence.

Optionally, in any of the preceding examples in accordance with the first example system, a further implementation provides that the technique can use one or more procedures selected from a group including classification and regression trees, support vector machines, artificial neural networks, logistic regression, naïve Bayes classification, linear discriminant analysis, and random forests.

Optionally, in any of the preceding examples in accordance with the first example system, a further implementation provides that the sensing circuitry can be operable to compute a soft indicator corresponding to a likelihood of distortion or a degree of objectionable, perceptible, or measurable distortion at an output of the speaker using a technique selected from a group including machine learning, statistical learning, predictive learning, and artificial intelligence.

Optionally, in any of the preceding examples in accordance with the first example system, a further implementation provides that the sensing circuitry can include multiple infinite impulse response (IIR) or finite impulse response (FIR) band-pass filters, and/or dynamic spectrum analysis filters, tuned to frequencies determined to contribute to distortion for the speaker.

Optionally, in any of the preceding examples in accordance with the first example system, a further implementation provides that the sensing circuitry can include circuitry to estimate amount of distortion activating energy in a filtered signal from the multiple IIR or FIR band-pass filters, and/or dynamic spectrum analysis filters, as one or more statistics computed from energy across all bands of the multiple band-pass filters, and includes circuitry to measure total energy of the filtered signal.

Optionally, in any of the preceding examples in accordance with the first example system, a further implementation provides that the one or more statistics can include one or more statistics from a group of statistics including a median, a mean, an arithmetic mean, a geometric mean, a maximum of the energy, a minimum of the energy, and energy of a nth largest energy among all band-pass energies computed with n being a selected positive integer.

Optionally, in any of the preceding examples in accordance with the first example system, a further implementation provides that the sensing circuitry can be arranged to compute energy as time-varying energy or compute an envelope of a full-band audio signal.

According to various embodiments, a first example method can comprise: receiving a signal from an audio signal source at a speaker; receiving the signal at sensing circuitry; generating statistics on the signal in the sensing circuitry; modifying the signal based on the generated statistics and directing the modified signal to the speaker; and generating, from the speaker, an acoustic output based on the received modified signal.

Optionally, in accordance with the preceding first example method, other implementations can provide operations associated with executing any of the preceding examples in accordance with the first example system.

According to various embodiments, there is provided a first example non-transitory computer-readable medium that stores computer instructions, that when executed by one or more processors, cause a system to perform the operations of: receiving a signal from an audio signal source at a speaker; receiving the signal at sensing circuitry; generating statistics on the signal in the sensing circuitry; modifying the signal based on the generated statistics and directing the modified signal to the speaker; and generating, from the speaker, an acoustic output based on the received modified signal.

Optionally, in accordance with the preceding first example non-transitory computer-readable medium that stores computer instructions, other implementations can provide operations associated with executing any of the preceding examples in accordance with the first example method and/or first example system.

According to various embodiments, a second example system can comprise: a multi-notch filter arranged to receive a signal for generating an acoustic output; sensing circuitry coupled to receive a filtered signal corresponding to the signal received and processed by the multi-notch filter, or corresponding to the signal output by a speaker, and to generate statistics on the filtered signal; a dynamic gain cell coupled to receive the statistics from the sensing circuitry and coupled to the multi-notch filter to operatively modify depth of the multi-notch filter; and a speaker to receive the filtered signal to generate the acoustic output.

Optionally, in accordance with the preceding second example system, another implementation provides that the sensing circuitry and other modules can be implemented on in a DSP.

Optionally, in any of the preceding examples in accordance with the second example system, a further implementation provides that the sensing circuitry can be operable to generate statistics that measure a likelihood of distortion at an output of the speaker, or the degree of objectionable, perceptible, or measurable distortion at an output of the speaker.

Optionally, in any of the preceding examples in accordance with the second example system, a further implementation provides that the sensing circuitry can be operable to compute a binary indicator of the distortion at an output of the speaker using a technique selected from a group including machine learning, statistical learning, predictive learning, or artificial intelligence.

Optionally, in any of the preceding examples in accordance with the second example system, a further implementation provides that a variable hangover time can be provided to the binary indicator in order to avoid situations where the trailing portion of distorted audio segments is missed.

Optionally, in any of the preceding examples in accordance with the second example system, a further implementation provides that a variable hang-before time can be provided to the binary indicator (with commensurate look-ahead or processing delay incorporated for the multi-notch processing) to avoid situations where the leading portion of distorted audio segments is missed.

Optionally, in any of the preceding examples in accordance with the second example system, a further implementation provides that the technique can use one or more procedures selected from a group including classification and regression trees, support vector machines, artificial neural networks, logistic regression, naïve Bayes classification, linear discriminant analysis, and random forests.

Optionally, in any of the preceding examples in accordance with the second example system, a further implementation provides that the sensing circuitry can be operable to compute a soft indicator corresponding to the likelihood of or the degree of objectionable, perceptible, or measurable distortion at an output of the speaker using a technique selected from a group including machine learning, statistical learning, predictive learning, and artificial intelligence.

Optionally, in any of the preceding examples in accordance with the second example system, a further implementation provides that the technique can use one or more procedures selected from a group including classification and regression trees, ordinary least squares regression, weighted least squares regression, support vector regression, an artificial neural network, piecewise-linear regression, ridge regression, lasso regression, elastic-net regression, and nonlinear regression.

Optionally, in any of the preceding examples in accordance with the second example system, a further implementation provides that a binary indicator can be derived from the soft indicator by use of a threshold or comparator device.

Optionally, in any of the preceding examples in accordance with the second example system, a further implementation provides that a semi-binary or semi-hard indicator can be derived from the soft indicator by use of a threshold, thereby yielding a constant indication for input indicator values above/below a certain threshold, and a variable indication for input indicator values below/above a certain threshold.

Optionally, in any of the preceding examples in accordance with the second example system, a further implementation provides that hysteresis can be incorporated in the derivation of the hard values of the binary or semi-binary indicator, to avoid issuing a binary indication for only brief excursions of the soft indicator past the threshold value(s).

Optionally, in any of the preceding examples in accordance with the second example system, a further implementation provides that the sensing circuitry includes multiple infinite impulse response (IIR) or finite impulse response (FIR) band-pass filters, and/or dynamic spectrum analysis filters, tuned to frequencies determined to contribute to distortion for the speaker.

Optionally, in any of the preceding examples in accordance with the second example system, a further implementation provides that the sensing circuitry can include circuitry to estimate amount of distortion activating energy in the filtered signal as a statistic computed from energy across all bands of the multiple band-pass filters, and can include circuitry to measure total energy of the filtered signal.

Optionally, in any of the preceding examples in accordance with the second example system, a further implementation provides that the statistic can be a median.

Optionally, in any of the preceding examples in accordance with the second example system, a further implementation provides that the statistic can be a mean.

Optionally, in any of the preceding examples in accordance with the second example system, a further implementation provides that the mean can be an arithmetic mean.

Optionally, in any of the preceding examples in accordance with the second example system, a further implementation provides that the mean can be a geometric mean.

Optionally, in any of the preceding examples in accordance with the second example system, a further implementation provides that the statistic can be a maximum.

Optionally, in any of the preceding examples in accordance with the second example system, a further implementation provides that the statistic can be a minimum.

Optionally, in any of the preceding examples in accordance with the second example system, a further implementation provides that the statistic can be the energy of the nth largest energy among all band-pass energies computed.

Optionally, in any of the preceding examples in accordance with the second example system, a further implementation provides that the sensing circuitry can compute the time-varying energy or envelope of the full-band audio signal.

Optionally, in any of the preceding examples in accordance with the second example system, a further implementation provides that the dynamic gain cell can be arranged to provide a gain to adjust the depth of the multi-notch filter based on a subsequent statistic computed from the time-varying energy or envelope of envelope of the full-band audio signal and the statistic.

According to various embodiments, a second example method can comprise: applying a multi-notch filter to a signal, the signal provided to generate an acoustic output; receiving a filtered signal, corresponding to the signal received and processed by the multi-notch filter or corresponding to the acoustic output, at sensing circuitry and generating statistics on the filtered signal using the sensing circuitry; modifying depth of the multi-notch filter based on the statistics, using a dynamic gain cell coupled to receive the statistics from the sensing circuitry; and receiving the filtered signal at a speaker and generating the acoustic output from the speaker.

Optionally, in accordance with the preceding second example method, other implementations can provide operations associated with executing any of the preceding examples in accordance with the second example system.

According to various embodiments, there is provided a second example non-transitory computer-readable medium that stores computer instructions, that when executed by one or more processors, cause a system to perform the operations of: applying a multi-notch filter to a signal, the signal provided to generate an acoustic output; receiving a filtered signal, corresponding to the signal received and processed by the multi-notch filter or corresponding to the acoustic output, at sensing circuitry and generating statistics on the filtered signal using the sensing circuitry; modifying depth of the multi-notch filter based on the statistics, using a dynamic gain cell coupled to receive the statistics from the sensing circuitry; and receiving the filtered signal at a speaker and generating the acoustic output from the speaker.

Optionally, in accordance with the preceding second example non-transitory computer-readable medium that stores computer instructions, other implementations can provide operations associated with executing any of the preceding examples in accordance with the second example method and/or second example system.

According to various embodiments, a third example system can comprise: a multi-notch filter arranged to receive a signal for generating an acoustic output; sensing circuitry coupled to receive a filtered signal corresponding to the signal received and processed by the multi-notch filter, or corresponding to the signal output by a speaker, and to generate statistics on the filtered signal; a dynamic gain cell coupled to receive the statistics from the sensing circuitry and coupled to the multi-notch filter to operatively modify depth of the multi-notch filter; a speaker to receive the filtered signal to generate the acoustic output; bass enhancement circuitry arranged to provide the signal to the multi-notch filter as a bass processed signal, the sensing circuitry coupled to receive the bass processed signal and to generate statistics on the bass processed signal; and a bass parameter controller coupled to receive the statistics from the sensing circuitry and coupled to the bass enhancement circuitry to operatively provide parameters to the bass enhancement circuitry.

Optionally, in the preceding example in accordance with the third example system, another implementation provides that the sensing circuitry and other modules can be implemented on in a DSP.

Optionally, in any of the preceding examples in accordance with the third example system, a further implementation provides that the sensing circuitry can be operable to generate statistics that measure a likelihood of distortion at an output of the speaker, or the degree of objectionable, perceptible, or measurable distortion at an output of the speaker.

Optionally, in any of the preceding examples in accordance with the third example system, a further implementation provides that the sensing circuitry can be operable to compute a binary indicator of the distortion at an output of the speaker using a technique selected from a group including machine learning, statistical learning, predictive learning, or artificial intelligence.

Optionally, in any of the preceding examples in accordance with the third example system, a further implementation provides that a variable hangover time can be provided to the binary indicator in order to avoid situations where the trailing portion of distorted audio segments is missed.

Optionally, in any of the preceding examples in accordance with the third example system, a further implementation provides that a variable hang-before time can be provided to the binary indicator (with commensurate look-ahead or processing delay incorporated for the multi-notch processing) to avoid situations where the leading portion of distorted audio segments is missed.

Optionally, in any of the preceding examples in accordance with the third example system, a further implementation provides that the technique can use one or more procedures selected from a group including classification and regression trees, support vector machines, artificial neural networks, logistic regression, naïve Bayes classification, linear discriminant analysis, and random forests.

Optionally, in any of the preceding examples in accordance with the third example system, a further implementation provides that the sensing circuitry can be operable to compute a soft indicator corresponding to the degree of objectionable, perceptible, or measurable distortion at an output of the speaker using a technique selected from a group including machine learning, statistical learning, predictive learning, and artificial intelligence.

Optionally, in any of the preceding examples in accordance with the third example system, a further implementation provides that the technique can use one or more procedures selected from a group including classification and regression trees, ordinary least squares regression, weighted least squares regression, support vector regression, an artificial neural network, piecewise-linear regression, ridge regression, lasso regression, elastic-net regression, and nonlinear regression.

Optionally, in any of the preceding examples in accordance with the third example system, a further implementation provides that a binary indicator can be derived from the soft indicator by use of a threshold or comparator device.

Optionally, in any of the preceding examples in accordance with the third example system, a further implementation provides that a semi-binary or semi-hard indicator can be derived from the soft indicator by use of a threshold, thereby yielding a constant indication for input indicator values above/below a certain threshold, and a variable indication for input indicator values below/above a certain threshold.

Optionally, in any of the preceding examples in accordance with the third example system, a further implementation provides that hysteresis can be incorporated in the derivation of the hard values of the binary or semi-binary indicator, to avoid issuing a binary indication for only brief excursions of the soft indicator past the threshold value(s).

Optionally, in any of the preceding examples in accordance with the third example system, a further implementation provides that the sensing circuitry can include multiple infinite impulse response (IIR) or finite impulse response (FIR) band-pass filters, and/or dynamic spectrum analysis filters, tuned to frequencies determined to contribute to distortion for the speaker.

Optionally, in any of the preceding examples in accordance with the third example system, a further implementation provides that the sensing circuitry can include circuitry to estimate amount of distortion activating energy in the filtered signal as a statistic computed from energy across all bands of the multiple band-pass filters, and includes circuitry to measure total energy of the filtered signal.

Optionally, in any of the preceding examples in accordance with the third example system, a further implementation provides that the statistic can be a median.

Optionally, in any of the preceding examples in accordance with the third example system, a further implementation provides that the statistic can be an mean, Optionally, in any of the preceding examples in accordance with the third example system, a further implementation provides that the mean can be an arithmetic mean.

Optionally, in any of the preceding examples in accordance with the third example system, a further implementation provides that the mean can be a geometric mean.

Optionally, in any of the preceding examples in accordance with the third example system, a further implementation provides that the statistic can be a maximum.

Optionally, in any of the preceding examples in accordance with the third example system, a further implementation provides that the statistic can be a minimum.

Optionally, in any of the preceding examples in accordance with the third example system, a further implementation provides that the statistic can be the energy of the nth largest energy among all band-pass energies computed.

Optionally, in any of the preceding examples in accordance with the third example system, a further implementation provides that the sensing circuitry can compute the time-varying energy or envelope of the full-band audio signal.

Optionally, in any of the preceding examples in accordance with the third example system, a further implementation provides that the bass enhancement circuitry can be operable to perform one or more bass enhancements selected from a group including bass enhancement based on linear filtering and bass enhancement based on insertion and/or generation of additional harmonics of a signal bearing audio content.

Optionally, in any of the preceding examples in accordance with the third example system, a further implementation provides that the bass enhancement circuitry can be an adaptive harmonic bass enhancement circuitry that employs tunable asymmetric nonlinearity along with pre-cutoff filtering and post-cutoff filtering to vary an amount of harmonic energy added to the received signal.

Optionally, in any of the preceding examples in accordance with the third example system, a further implementation provides that the bass parameter controller can be arranged to operatively provide parameters to control bass amplitude and bass harmonic level.

Optionally, in any of the preceding examples in accordance with the third example system, a further implementation provides that the signal is a digital signal.

According to various embodiments, a third example method can comprise: applying a multi-notch filter to a signal, the signal provided for generating an acoustic output; receiving a filtered signal, corresponding to the signal received and processed by the multi-notch filter, at sensing circuitry and generating statistics on the filtered signal using the sensing circuitry; modifying depth of the multi-notch filter based on the statistics, using a dynamic gain cell coupled to receive the statistics from the sensing circuitry; and receiving the filtered signal at a speaker and generating the acoustic output from the speaker, wherein applying the signal to the multi-notch filter can include providing the signal to the multi-notch filter as a bass processed signal resulting from processing by bass enhancement circuitry, wherein processing by bass enhancement circuitry can include generating statistics on the bass processed signal using the sensing circuitry; generating parameters based on the statistics on the bass processed signal; and using the parameters to provide bass enhancement for the signal applied to the multi-notch filter.

Optionally, in accordance with the preceding third example method, other implementations can provide operations associated with executing any of the preceding examples in accordance with the third example system.

According to various embodiments, there is provided a third example non-transitory computer-readable medium that stores computer instructions, that when executed by one or more processors, cause a system to perform the operations of: applying a multi-notch filter to a signal, the signal provided for generating an acoustic output; receiving a filtered signal, corresponding to the signal received and processed by the multi-notch filter, at sensing circuitry and generating statistics on the filtered signal using the sensing circuitry; modifying depth of the multi-notch filter based on the statistics, using a dynamic gain cell coupled to receive the statistics from the sensing circuitry; and receiving the filtered signal at a speaker and generating the acoustic output from the speaker, wherein applying the signal to the multi-notch filter can include providing the signal to the multi-notch filter as a bass processed signal resulting from processing by bass enhancement circuitry, wherein processing by bass enhancement circuitry can include generating statistics on the bass processed signal using the sensing circuitry; generating parameters based on the statistics on the bass processed signal; and using the parameters to provide bass enhancement for the signal applied to the multi-notch filter.

Optionally, in accordance with the preceding third example non-transitory computer-readable medium that stores computer instructions, other implementations can provide operations associated with executing any of the preceding examples in accordance with the third example method and/or third example system.

According to various embodiments, a fourth example system can comprise: bass enhancement circuitry arranged to receive a signal for generating an acoustic output; sensing circuitry coupled to receive a bass enhanced signal corresponding to the signal received and processed by the bass enhancement circuitry; or corresponding to the acoustic output, and to generate statistics on the bass enhanced or speaker-output signal; a bass parameter controller coupled to receive the statistics from the sensing circuitry and coupled to the bass enhancement circuitry to operatively provide parameters to the bass enhancement circuitry; and a speaker to receive the bass enhanced signal to generate the acoustic output.

Optionally, in the preceding example in accordance with the fourth example system, another implementation provides that the sensing circuitry and other modules can be implemented in a DSP.

Optionally, in any of the preceding examples in accordance with the fourth example system, a further implementation provides that the sensing circuitry can be operable to generate statistics that measure a likelihood of distortion at an output of the speaker, or the degree of objectionable, perceptible, or measurable distortion at an output of the speaker.

Optionally, in any of the preceding examples in accordance with the fourth example system, a further implementation provides that the sensing circuitry can be operable to compute a binary indicator of the distortion at an output of the speaker using a technique selected from a group including machine learning, statistical learning, predictive learning, or artificial intelligence.

Optionally, in any of the preceding examples in accordance with the fourth example system, a further implementation provides that a variable hangover time can be provided to the binary indicator in order to avoid situations where the trailing portion of distorted audio segments is missed.

Optionally, in any of the preceding examples in accordance with the fourth example system, a further implementation provides that a variable hang-before time can be provided to the binary indicator (with commensurate look-ahead or processing delay incorporated for the multi-notch processing) to avoid situations where the leading portion of distorted audio segments is missed.

Optionally, in any of the preceding examples in accordance with the fourth example system a further implementation provides that the technique can use one or more procedures selected from a group including classification and regression trees, support vector machines, artificial neural networks, logistic regression, naïve Bayes classification, linear discriminant analysis, and random forests.

Optionally, in any of the preceding examples in accordance with the fourth example system, a further implementation provides that the sensing circuitry can be operable to compute a soft indicator corresponding to the likelihood of or the degree of objectionable, perceptible, or measurable distortion at an output of the speaker using a technique selected from a group including machine learning, statistical learning, predictive learning, and artificial intelligence.

Optionally, in any of the preceding examples in accordance with the fourth example system, a further implementation provides that the technique can use one or more procedures selected from a group including classification and regression trees, ordinary least squares regression, weighted least squares regression, support vector regression, an artificial neural network, piecewise-linear regression, ridge regression, lasso regression, elastic-net regression, and nonlinear regression.

Optionally, in any of the preceding examples in accordance with the fourth example system, a further implementation provides that a binary indicator can be derived from the soft indicator by use of a threshold or comparator device.

Optionally, in any of the preceding examples in accordance with the fourth example system, a further implementation provides that a semi-binary or semi-hard indicator can be derived from the soft indicator by use of a threshold, thereby yielding a constant indication for input indicator values above/below a certain threshold, and a variable indication for input indicator values below/above a certain threshold.

Optionally, in any of the preceding examples in accordance with the fourth example system, a further implementation provides that hysteresis can be incorporated in the derivation of the hard values of the binary or semi-binary indicator, to avoid issuing a binary indication for only brief excursions of the soft indicator past the threshold value(s).

Optionally, in any of the preceding examples in accordance with the fourth example system, a further implementation provides that the sensing circuitry can include multiple infinite impulse response (IIR) or finite impulse response (FIR) band-pass filters, and/or dynamic spectrum analysis filters, tuned to frequencies determined to contribute to distortion for the speaker.

Optionally, in any of the preceding examples in accordance with the fourth example system, a further implementation provides that the sensing circuitry can include circuitry to estimate amount of distortion activating energy in the filtered signal as a statistic computed from energy across all bands of the multiple band-pass filters, and includes circuitry to measure total energy of the filtered signal.

Optionally, in any of the preceding examples in accordance with the fourth example system, a further implementation provides that the statistic can be a median.

Optionally, in any of the preceding examples in accordance with the fourth example system, a further implementation provides that the statistic can be a mean, Optionally, in any of the preceding examples in accordance with the fourth example system, a further implementation provides that the mean can be an arithmetic mean.

Optionally, in any of the preceding examples in accordance with the fourth example system, a further implementation provides that the mean can be a geometric mean.

Optionally, in any of the preceding examples in accordance with the fourth example system, a further implementation provides that the statistic can be a maximum.

Optionally, in any of the preceding examples in accordance with the fourth example system, a further implementation provides that the statistic can be a minimum.

Optionally, in any of the preceding examples in accordance with the fourth example system, a further implementation provides that the statistic can be the energy of the nth largest energy among all band-pass energies computed.

Optionally, in any of the preceding examples in accordance with the fourth example system, a further implementation provides that the bass enhancement circuitry can be operable to perform one or more bass enhancements selected from a group including bass enhancement based on linear filtering and bass enhancement based on insertion and/or generation of additional harmonics of a signal bearing audio content.

Optionally, in any of the preceding examples in accordance with the fourth example system, a further implementation provides that the bass enhancement circuitry can be adaptive harmonic bass enhancement circuitry that employs tunable asymmetric nonlinearity along with pre-cutoff filtering and post-cutoff filtering to vary an amount of harmonic energy added to the received signal.

Optionally, in any of the preceding examples in accordance with the fourth example system, a further implementation provides that the bass parameter controller can be arranged to operatively provide parameters to control bass amplitude and bass harmonic level.

According to various embodiments, a fourth example method can comprise: receiving a signal at bass enhancement circuitry, the signal provided for generating an acoustic output; receiving a bass enhanced signal, corresponding to the signal received and processed by the bass enhancement circuitry or corresponding to the acoustic output, at sensing circuitry and generating statistics on the bass enhanced signal using the sensing circuitry; generating, in a bass parameter controller, parameters based on the statistics on the bass processed signal and using the parameters to provide bass enhancement to the signal applied the bass enhancement circuitry; and receiving the bass enhanced signal at a speaker and generating the acoustic output from the speaker.

Optionally, in accordance with the preceding fourth example method, other implementations can provide operations associated with executing any of the preceding examples in accordance with the fourth example system.

According to various embodiments, there is provided a fourth example non-transitory computer-readable medium that stores computer instructions, that when executed by one or more processors, cause a system to perform the operations of: receiving a signal at bass enhancement circuitry, the signal provided for generating an acoustic output; receiving a bass enhanced signal, corresponding to the signal received and processed by the bass enhancement circuitry or corresponding to the acoustic output, at sensing circuitry and generating statistics on the bass enhanced signal using the sensing circuitry; generating, in a bass parameter controller, parameters based on the statistics on the bass processed signal and using the parameters to provide bass enhancement to the signal applied the bass enhancement circuitry; and receiving the bass enhanced signal at a speaker and generating the acoustic output from the speaker.

Optionally, in accordance with the preceding fourth example non-transitory computer-readable medium that stores computer instructions, other implementations can provide operations associated with executing any of the preceding examples in accordance with the fourth example method and/or fourth example system.

According to various embodiments, a fifth example system can comprise: bass enhancement circuitry arranged to receive a signal to generate an acoustic output; a multi-notch filter arranged to receive the bass enhanced signal or a processed form of the bass enhanced signal and arranged to provide a filtered bass enhanced signal; sensing circuitry coupled to receive an output of the multi-notch filter to receive the filtered bass enhanced signal corresponding to the signal received and processed by the bass enhancement circuitry and the multi-notch filter or corresponding to the acoustic output, and to generate statistics on the filtered bass enhanced signal; a bass parameter controller coupled to receive the statistics from the sensing circuitry and coupled to the bass enhancement circuitry to operatively provide parameters to the bass enhancement circuitry to enhance the signal; and a dynamic gain cell coupled to receive the statistics from the sensing circuitry and coupled to the multi-notch filter to operatively modify depth of the multi-notch filter; and a speaker to receive the filtered bass enhanced signal to generate the acoustic output.

Optionally, in the preceding example in accordance with the fifth example system, another implementation provides that the sensing circuitry and other modules can be implemented in a DSP.

Optionally, in any of the preceding examples in accordance with the fifth example system, a further implementation provides that an amplifier and/or post-processor can be coupled between the multi-notch filter and the speaker.

Optionally, in any of the preceding examples in accordance with the fifth example system, a further implementation provides that an audio processor can be coupled between the bass enhancement circuitry and the multi-notch filter.

According to various embodiments, a fifth example method can comprise: receiving a signal at bass enhancement circuitry and generating a bass enhanced signal, the signal provided for generating an acoustic output; receiving the bass enhanced signal or a processed form of the bass enhanced signal in a multi-notch filter, the multi-notch filter arranged to provide a filtered bass enhanced signal; receiving the filtered bass enhanced signal, corresponding to the signal received and processed by the bass enhancement circuitry and the multi-notch filter or corresponding to the acoustic output, at sensing circuitry and generating statistics on the filtered bass enhanced signal using the sensing circuitry; generating, in a bass parameter controller, parameters based on the statistics on the filtered bass processed signal and using the parameters to provide bass enhancement to the signal applied the bass enhancement circuitry; receiving the statistics from the sensing circuitry in a dynamic gain cell and modifying depth of the multi-notch filter using the dynamic gain cell based on the received statistics; generating the filtered bass enhanced signal from the multi-notch filter having the modified depth; and receiving the filtered bass enhanced signal at a speaker and generating the acoustic output from the speaker.

Optionally, in accordance with the preceding fifth example method, other implementations can provide operations associated with executing any of the preceding examples in accordance with the fifth example system.

According to various embodiments, there is provided a fifth example non-transitory computer-readable medium that stores computer instructions, that when executed by one or more processors, cause a system to perform the operations of: receiving a signal at bass enhancement circuitry and generating a bass enhanced signal, the signal provided for generating an acoustic output; receiving the bass enhanced signal or a processed form of the bass enhanced signal in a multi-notch filter, the multi-notch filter arranged to provide a filtered bass enhanced signal; receiving the filtered bass enhanced signal, corresponding to the signal received and processed by the bass enhancement circuitry and the multi-notch filter or corresponding to the acoustic output, at sensing circuitry and generating statistics on the filtered bass enhanced signal using the sensing circuitry; generating, in a bass parameter controller, parameters based on the statistics on the filtered bass processed signal and using the parameters to provide bass enhancement to the signal applied the bass enhancement circuitry; receiving the statistics from the sensing circuitry in a dynamic gain cell and modifying depth of the multi-notch filter using the dynamic gain cell based on the received statistics; generating the filtered bass enhanced signal from the multi-notch filter having the modified depth; and receiving the filtered bass enhanced signal at a speaker and generating the acoustic output from the speaker.

Optionally, in accordance with the preceding fifth example non-transitory computer-readable medium that stores computer instructions, other implementations can provide operations associated with executing any of the preceding examples in accordance with the fifth example method and/or fifth example system.

Many other variations than those described herein will be apparent from studying this document. For example, depending on the embodiment, certain acts, events, or functions of any of the methods and algorithms described herein can be performed in a different sequence, can be added, merged, or left out altogether (such that not all described acts or events are necessary for the practice of the methods and algorithms). Moreover, in certain embodiments, acts or events can be performed concurrently, such as through multi-threaded processing, interrupt processing; or multiple processors or processor cores or on other parallel architectures, rather than sequentially. In addition, different tasks or processes can be performed by different machines and computing systems that can function together.

The various illustrative logical blocks, modules, methods, and algorithm processes and sequences described in connection with the embodiments disclosed herein can be implemented as electronic hardware, computer software, or combinations of both. To clearly illustrate this interchangeability of hardware and software, various illustrative components, blocks, modules, and process actions have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of this document.

Embodiments of the system and method described herein are operational within numerous types of general purpose or special purpose computing system environments or configurations. In general, a computing environment can include any type of computer system, including, but not limited to, a computer system based on one or more microprocessors, a mainframe computer, a digital signal processor, a portable computing device, a personal organizer, a device controller, a computational engine within an appliance, a mobile phone, a desktop computer, a mobile computer, a tablet computer, a smartphone, and appliances with an embedded computer, to name a few.

Such computing devices can be typically be found in devices having at least some minimum computational capability, including, but not limited to, personal computers, server computers, hand-held computing devices, laptop or mobile computers, communications devices such as cell phones and PDA's, multiprocessor systems, microprocessor-based systems, set top boxes, programmable consumer electronics, network PCs, minicomputers, mainframe computers, audio or video media players, and so forth. In some embodiments the computing devices will include one or more processors. Each processor may be a specialized microprocessor, such as a DSP, a very long instruction word (VLIW), or other microcontroller, or can be conventional central processing units (CPUs) having one or more processing cores, including specialized graphics processing unit (GPU)-based cores in a multi-core CPU.

The process actions of a method, process, or algorithm described in connection with the embodiments disclosed herein can be embodied directly in hardware, in a software module executed by a processor, or in any combination of the two. The software module can be contained in computer-readable media that can be accessed by a computing device. The computer-readable media can include both volatile and nonvolatile media, which are either removable, non-removable, or some combination thereof. The computer-readable media is used to store information such as computer-readable or computer-executable instructions, data structures, program modules, or other data. By way of example, and not limitation, computer readable media may comprise computer storage media and communication media.

Computer storage media includes, but is not limited to, computer or machine readable media or storage devices such as Bluray discs (BD), digital versatile discs (DVDs), compact discs (CDs), floppy disks, tape drives, hard drives, optical drives, solid state memory devices, RAM memory, ROM memory, EPROM memory, EEPROM memory, flash memory or other memory technology, magnetic cassettes, magnetic tapes, magnetic disk storage, or other magnetic storage devices, or any other device which can be used to store the desired information and which can be accessed by one or more computing devices.

A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An exemplary storage medium can be coupled to the processor such that the processor can read information from, and write information to, the storage medium. In the alternative, the storage medium can be integral to the processor. The processor and the storage medium can reside in an ASIC. The ASIC can reside in a user terminal. Alternatively, the processor and the storage medium can reside as discrete components in a user terminal.

The phrase "non-transitory" as used in this document means "enduring or long-lived". The phrase "non-transitory computer-readable media" includes any and all computer-readable media, with the sole exception of a transitory, propagating signal. This includes, by way of example and not limitation, non-transitory computer-readable media such as register memory, processor cache and random-access memory (RAM).

Retention of information such as computer-readable or computer-executable instructions, data structures, program modules, and so forth, can also be accomplished by using a variety of the communication media to encode one or more modulated data signals, electromagnetic waves (such as carrier waves), or other transport mechanisms or communications protocols, and includes any wired or wireless information delivery mechanism. In general, these communication media refer to a signal that has one or more of its characteristics set or changed in such a manner as to encode information or instructions in the signal. For example, communication media includes wired media such as a wired network or direct-wired connection carrying one or more modulated data signals, and wireless media such as acoustic, radio frequency (RF), infrared, laser, and other wireless media for transmitting, receiving, or both, one or more modulated data signals or electromagnetic waves. Combinations of the any of the above should also be included within the scope of communication media.

Further, one or any combination of software, programs, computer program products that embody some or all of the various embodiments of the distortion sensing/distortion reduction system and/or bass management system and methods described herein, or portions thereof, may be stored, received, transmitted, or read from any desired combination of computer or machine readable media or storage devices and communication media in the form of computer executable instructions or other data structures.

Embodiments of the system and method described herein may be further described in the general context of computer-executable instructions, such as program modules, being executed by a computing device. Generally, program modules include routines, programs, objects, components, data structures, and so forth, which perform particular tasks or implement particular abstract data types. The embodiments described herein may also be practiced in distributed computing environments where tasks are performed by one or more remote processing devices, or within a cloud of one or more devices, that are linked through one or more communications networks. In a distributed computing environment, program modules may be located in both local and remote computer storage media including media storage devices. Still further, the aforementioned instructions may be implemented, in part or in whole, as hardware logic circuits, which may include a processor.

Conditional language used herein, such as, among others, "can," "might," "may," "e.g.," and the like, unless specifically stated otherwise, or otherwise understood within the context as used, is generally intended to convey that certain embodiments include certain features, elements and/or states. Thus, such conditional language is not generally intended to imply that features, elements, and/or states are in any way required for one or more embodiments or that one or more embodiments necessarily include logic for deciding whether these features, elements, and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. While the above detailed description has shown, described, and pointed out novel features as applied to various embodiments, it will be understood that various omissions, substitutions, and changes in the form and details of the devices or algorithms illustrated can be made without departing from the scope of the disclosure.

As will be recognized, certain embodiments of the inventions described herein can be embodied within a form that does not provide all of the features and benefits set forth herein, as some features can be used or practiced separately from others. Moreover, although the subject matter has been described in language specific to structural features and methodological acts, it is to be understood that the subject matter defined in the appended claims is not necessarily limited to the specific features or acts described above. Rather, the specific features and acts described above are disclosed as example forms of implementing the claims.

What is claimed is:

1. A system comprising:
   a multi-notch filter arranged to receive a signal to generate an acoustic output;
   sensing circuitry coupled to receive a filtered signal corresponding to the received signal and processed by the multi-notch filter, or corresponding to the acoustic output, and to generate statistics on the filtered signal;

a dynamic gain cell coupled to receive the statistics from the sensing circuitry and coupled to the multi-notch filter to operatively modify a depth of the multi-notch filter, the dynamic gain cell having inputs to receive a measure of bandpass energy and a measure of signal energy from the sensing circuitry and having a threshold parameter of distortion activating energy at which the multi-notch filter begins to engage and a sensitivity parameter such that operative modification of the depth includes operatively modifying the depth greater than a difference between the distortion activating energy and the threshold parameter; and a speaker to receive the filtered signal to generate the acoustic output.

2. A system comprising:

a multi-notch filter arranged to receive a signal to generate an acoustic output;

sensing circuitry coupled to receive a filtered signal corresponding to the received signal and processed by the multi-notch filter, or corresponding to the acoustic output, and to generate statistics on the filtered signal;

a dynamic gain cell coupled to receive the statistics from the sensing circuitry and coupled to the multi-notch filter to operatively modify a depth of the multi-notch filter; and a speaker to receive the filtered signal to generate the acoustic output, wherein the multi-notch filter, the sensing circuitry, and the dynamic gain cell are disposed in a digital signal processor.

3. The system of claim 1, wherein the sensing circuitry is operable to generate statistics that measure a likelihood of distortion at an output of the speaker.

4. A system comprising:

a multi-notch filter arranged to receive a signal to generate an acoustic output;

sensing circuitry coupled to receive a filtered signal corresponding to the received signal and, processed by the multi-notch filter or corresponding to the acoustic output, and to generate statistics on the filtered signal, wherein the sensing circuitry is operable to generate statistics that measure a likelihood of distortion at an output of the speaker;

a dynamic gain cell coupled to receive the statistics from the sensing circuitry and coupled to the multi-notch filter to operatively modify a depth of the multi-notch filter; and a speaker to receive the filtered signal to generate the acoustic output, wherein the sensing circuitry is operable to compute the measure of the likelihood of distortion at the output of the speaker using a technique selected from a group including machine learning, statistical learning, predictive learning, and artificial intelligence.

5. A system comprising:

a multi-notch filter arranged to receive a signal to generate an acoustic output;

sensing circuitry coupled to receive a filtered signal corresponding to the received signal and processed by the multi-notch filter, or corresponding to the acoustic output, and to generate statistics on the filtered signal, the sensing circuitry is operable to generate statistics that measure a likelihood of distortion at an output of the speaker;

a dynamic gain cell coupled to receive the statistics from the sensing circuitry and coupled to the multi-notch filter to operatively modify a depth of the multi-notch filter; and a speaker to receive the filtered signal to generate the acoustic output, wherein the sensing circuitry is operable to compute a binary indicator of the distortion at the output of the speaker using a technique selected from a group including machine learning, statistical learning, predictive learning, or artificial intelligence.

6. A system comprising:

a multi-notch filter arranged to receive a signal to generate an acoustic output;

sensing circuitry coupled to receive a filtered signal corresponding to the received signal and processed by the multi-notch filter, or corresponding to the acoustic output, and to generate statistics on the filtered signal;

a dynamic gain cell coupled to receive the statistics from the sensing circuitry and coupled to the multi-notch filter to operatively modify a depth of the multi-notch filter; and a speaker to receive the filtered signal to generate the acoustic output, wherein the sensing circuitry includes multiple infinite impulse response (IIR) or finite-impulse response (FIR) bandpass filters, and/or dynamic spectrum analysis filters, tuned to frequencies determined to contribute to distortion for the speaker and includes circuitry to estimate amount of distortion activating energy in a filtered signal from the multiple IIR or FIR bandpass filters, and/or dynamic spectrum analysis filters, as one or more statistics of energy across all bands of the multiple IIR or FIR bandpass filters and/or dynamic spectrum analysis filters, and includes circuitry to measure total energy of the filtered signal.

7. The system of claim 6, wherein the dynamic gain cell is arranged to provide a gain to adjust the depth of the multi-notch filter based on the one or more statistics.

8. A method comprising:

applying a multi-notch filter to a signal, the signal provided to generate an acoustic output;

receiving a filtered signal, corresponding to the signal received and processed by the multi-notch filter or corresponding to the acoustic output, at sensing circuitry and generating statistics on the filtered signal using the sensing circuitry;

modifying depth of the multi-notch filter based on the statistics, using a dynamic gain cell coupled to receive the statistics, including a measure of bandpass energy and a measure of signal energy, from the sensing circuitry, the dynamic gain cell having a threshold parameter of distortion activating energy at which the multi-notch filter begins to engage and a sensitivity parameter such that modifying depth includes operatively modifying the depth greater than a difference between the distortion activating energy and the threshold parameter; and receiving the filtered signal at a speaker and generating the acoustic output from the speaker.

9. The method of claim 8, wherein receiving a filtered signal processed by the multi-notch filter, generating statistics on the filtered signal, and modifying the depth of the multi-notch filter are implemented in a digital signal processor.

10. The method of claim 8, wherein generating statistics includes generating statistics that measure a likelihood of distortion at an output of the speaker.

11. A method comprising:
applying a multi-notch filter to a signal, the signal provided to generate an acoustic output;
receiving a filtered signal, corresponding to the signal received and processed by the multi-notch filter or corresponding to the acoustic output, at sensing circuitry and generating statistics on the filtered signal using the sensing circuitry, wherein generating statistics includes generating statistics that measure a likelihood of distortion at an output of the speaker,
modifying depth of the multi-notch filter based on the statistics, using a dynamic gain cell coupled to receive the statistics from the sensing circuitry; and
receiving the filtered signal at a speaker and generating the acoustic output from the speaker, wherein the method includes computing, in the sensing circuitry, the measure of the likelihood of distortion at the output of the speaker using a technique selected from a group including machine learning, statistical learning, predictive learning, and artificial intelligence.

12. A method comprising:
applying a multi-notch filter to a signal, the signal provided to generate an acoustic output;
receiving a filtered signal, corresponding to the signal received and processed by the multi-notch filter or corresponding to the acoustic output, at sensing circuitry and generating statistics on the filtered signal using the sensing circuitry;
modifying depth of the multi-notch filter based on the statistics, using a dynamic gain cell coupled to receive the statistics from the sensing circuitry; and
receiving the filtered signal at a speaker and generating the acoustic output from the speaker, wherein the method includes computing, in the sensing circuitry, a binary indicator of the distortion at the output of the speaker using a technique selected from a group including machine learning, statistical learning, predictive learning, or artificial intelligence.

13. A method comprising:
applying a multi-notch filter to a signal, the signal provided to generate an acoustic output;
receiving a filtered signal, corresponding to the signal received and processed by the multi-notch filter or corresponding to the acoustic output, at sensing circuitry and generating statistics on the filtered signal using the sensing circuit;
modifying depth of the multi-notch filter based on the statistics, using a dynamic gain cell coupled to receive the statistics from the sensing circuitry; and
receiving the filtered signal at a speaker and generating the acoustic output from the speaker, wherein generating statistics using the sensing circuitry includes using sensing circuitry having multiple infinite impulse response (IIR) or finite-impulse response (FIR) bandpass filters, and/or dynamic spectrum analysis filters, tuned to frequencies determined to contribute to distortion for the speaker, estimating an amount of distortion activating energy in a filtered signal from the multiple IIR bandpass filters and/or dynamic spectrum analysis filters as one or more statistics of energy across all bands of the multiple IIR or FIR bandpass filters and/or dynamic spectrum analysis filters, and measuring total energy of the filtered signal.

14. The method of claim 13, wherein using the dynamic gain cell includes providing a gain to adjust the depth of the multi-notch filter based on the one or more statistics.

* * * * *